(12) United States Patent
Baek et al.

(10) Patent No.: US 11,430,839 B2
(45) Date of Patent: Aug. 30, 2022

(54) DISPLAY PANEL HAVING ACTIVE LAYER WITH A SURFACE LAYER IN WHICH F CONCENTRATION IS GREATER THAN A CORE LAYER

(71) Applicant: Samsung Display Co., Ltd., Yongin-si (KR)

(72) Inventors: Jongjun Baek, Seoul (KR); Jaewoo Jeong, Suwon-si (KR); Byungsoo So, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 150 days.

(21) Appl. No.: 16/843,368

(22) Filed: Apr. 8, 2020

(65) Prior Publication Data
US 2020/0335560 A1 Oct. 22, 2020

(30) Foreign Application Priority Data
Apr. 16, 2019 (KR) ........................ 10-2019-0044117

(51) Int. Cl.
*H01L 27/32* (2006.01)
*H01L 29/66* (2006.01)
*H01L 51/00* (2006.01)
*H01L 21/02* (2006.01)
*H01L 21/225* (2006.01)

(52) U.S. Cl.
CPC .... *H01L 27/3244* (2013.01); *H01L 29/66757* (2013.01); *H01L 21/02675* (2013.01); *H01L 21/2253* (2013.01); *H01L 51/0097* (2013.01); *H01L 2227/323* (2013.01)

(58) Field of Classification Search
CPC .......... H01L 27/3244; H01L 29/66757; H01L 51/0097
See application file for complete search history.

(56) References Cited

U.S. PATENT DOCUMENTS

| | | | |
|---|---|---|---|
| 5,440,168 A * | 8/1995 | Nishimura | ........ H01L 29/66765 257/285 |
| 6,492,695 B2 | 12/2002 | Lutze | |
| 7,078,302 B2 | 7/2006 | Ma et al. | |
| 7,541,675 B2 | 6/2009 | Hwang | |

(Continued)

FOREIGN PATENT DOCUMENTS

| | | |
|---|---|---|
| KR | 2001-0072572 A | 7/2001 |
| KR | 10-0760923 B1 | 9/2007 |

(Continued)

*Primary Examiner* — Michael Jung
(74) *Attorney, Agent, or Firm* — Lewis Roca Rothgerber Christie LLP

(57) ABSTRACT

A display panel includes: a base substrate; a circuit layer on the base substrate; and a display element layer on the circuit layer, wherein the circuit layer includes an active layer on the base substrate and containing boron and fluorine; a control electrode on the active layer; and a control electrode insulation layer between the active layer and the control electrode, wherein the active layer includes: a core layer in which a concentration of the boron is greater than a concentration of the fluorine; and a surface layer on the core layer and in which a concentration of the fluorine is greater than a concentration of the boron.

13 Claims, 16 Drawing Sheets

(56) References Cited

U.S. PATENT DOCUMENTS

| | | | |
|---|---|---|---|
| 2009/0261337 A1* | 10/2009 | Sakakura | H01L 27/283 257/72 |
| 2010/0224879 A1* | 9/2010 | Miyairi | H01L 29/78678 257/57 |
| 2013/0099231 A1* | 4/2013 | Tochibayashi | H01L 29/7869 257/43 |
| 2014/0264484 A1 | 9/2014 | Sassiat et al. | |
| 2015/0021592 A1* | 1/2015 | Seo | H01L 29/7869 257/43 |
| 2015/0064860 A1* | 3/2015 | Kim | H01L 21/02521 438/197 |
| 2015/0102317 A1* | 4/2015 | Kim | H01L 29/78606 257/40 |
| 2019/0088794 A1* | 3/2019 | Jeong | H01L 27/1274 |

FOREIGN PATENT DOCUMENTS

| | | |
|---|---|---|
| KR | 10-0765620 B1 | 10/2007 |
| KR | 10-1118330 B1 | 3/2012 |
| KR | 10-2014-0113311 A | 9/2014 |

\* cited by examiner

DISPLAY PANEL HAVING ACTIVE LAYER WITH A SURFACE LAYER IN WHICH F CONCENTRATION IS GREATER THAN A CORE LAYER

CROSS-REFERENCE TO RELATED APPLICATIONS

The present application claims priority to and the benefit of Korean Patent Application No. 10-2019-0044117, filed on Apr. 16, 2019, the entire content of which is hereby incorporated by reference.

BACKGROUND

Aspects of some example embodiments of the present disclosure herein relate to a display panel and a method for manufacturing the display panel.

Recently, in order to facilitate portability and improve user convenience, display devices that are foldable or rollable by utilizing bendable flexible display members are being developed.

Such flexible display devices may use a polymer film as a base substrate such that the shape thereof may be freely deformed. When an organic material such as a polymer film is used as a base substrate, during a subsequent process of forming a circuit layer and the like on a base substrate, there may be a limitation with respect to a processing temperature and the like in order to minimize or reduce the damage to the base substrate. For example, the case in which transistors are formed on a base substrate, may have a performance deterioration problem due to the limitation of the process temperature, compared with the case in which a high-temperature semiconductor process is performed.

The above information disclosed in this Background section is only for enhancement of understanding of the background and therefore the information discussed in this Background section does not necessarily constitute prior art.

SUMMARY

Aspects of some example embodiments of the present disclosure herein relate to a display panel and a method for manufacturing the display panel, and for example, to a display panel having a circuit layer containing polycrystalline silicon, and to a method for manufacturing the display panel.

Aspects of some example embodiments of the present disclosure may include a display panel in which a transistor included in a circuit layer has relatively improved performance and reliability.

Aspects of some example embodiments of the present disclosure may also include a method for manufacturing a display panel exhibiting relatively improved reliability properties by controlling manufacturing steps of an active layer and a doping material.

According to some example embodiments of the inventive concept, a display panel includes: a base substrate, a circuit layer on the base substrate, and a display element layer on the circuit layer, wherein the circuit layer includes an active layer on the base substrate and containing boron and fluorine, a control electrode on the active layer, and a control electrode insulation layer between the active layer and the control electrode, wherein the active layer includes a core layer in which the concentration of the boron is greater than the concentration of the fluorine, and a surface layer in which the concentration of the fluorine is greater than the concentration of the boron.

According to some example embodiments, the surface layer may include a first surface layer adjacent to the control electrode insulation layer and a second surface layer adjacent to the base substrate.

According to some example embodiments, the concentration of the fluorine in each of the first surface layer and the second surface layer may be greater than the concentration of the fluorine in the core layer.

According to some example embodiments, the thickness of the surface layer to the total thickness of the active layer may be 10% to 30%.

According to some example embodiments, the base substrate may be a polyimide substrate.

According to some example embodiments, the active layer may include a channel region overlapping the control electrode, and a first ion doping region and a second ion doping region respectively located at both sides of the channel region, wherein the concentration of the boron in each of the first ion doping region and the second ion doping region is greater than the concentration of the boron in the channel region.

According to some example embodiments, the circuit layer may further include an input electrode connected to the first ion doping region, and an output electrode connected to the second ion doping region.

According to some example embodiments, the display element layer may include a first electrode electrically connected to the output electrode, a second electrode facing the first electrode, and a light emitting layer between the first electrode and the second electrode.

According to some example embodiments, the display element layer may include an organic electroluminescent element or a quantum dot light emitting element.

According to some example embodiments, the display panel may further include a buffer layer between the base substrate and the active layer.

According to some example embodiments of the inventive concept, a display panel includes: at least one folding region includes a base substrate, a circuit layer on the base substrate, and a display element layer on the circuit layer and including a light emitting element, wherein the circuit layer includes an active layer on the base substrate and containing boron and fluorine, a control electrode on the active layer, and a control electrode insulation layer between the active layer and the control electrode, wherein the concentration of the fluorine at the surface of the active layer adjacent to the control electrode insulation layer is greater than the concentration of the fluorine in a core portion of the active layer.

According to some example embodiments, the active layer may include a channel region overlapping the control electrode, and a first ion doping region and a second ion doping region respectively located at both sides of the channel region, wherein the concentration of the boron in each of the first ion doping region and the second ion doping region is greater than the concentration of the boron in the channel region.

According to some example embodiments, the base substrate may include polyimide.

According to some example embodiments of the inventive concept, in a method for manufacturing a display panel, the method includes: forming a circuit layer and forming a display element layer, wherein the forming of a circuit layer includes providing a preliminary active layer containing amorphous silicon on a base substrate, primarily doping the preliminary active layer with first ions, secondarily doping the primarily doped preliminary active layer with second ions different from the first ions, forming an active layer by providing laser light to the secondarily doped preliminary active layer, providing a control electrode insulation layer on the active layer, forming a control electrode on the control electrode insulation layer, tertiary doping the active layer with the first ions, and heat treating the active layer.

According to some example embodiments, the first ions may be boron ions and the second ions may be fluorine ions.

According to some example embodiments, the providing of the preliminary active layer may be depositing the amorphous silicon.

According to some example embodiments, the forming of an active layer by providing laser light may include forming polycrystalline silicon by providing the laser light to the amorphous silicon.

According to some example embodiments, the tertiary doping of the active layer may include using the control electrode as a mask to form an ion doping region not overlapping the control electrode.

According to some example embodiments, the heat treating of the active layer may be activating the active layer by providing heat of 250° C. to 480° C.

According to some example embodiments, the base substrate may include polyimide.

BRIEF DESCRIPTION OF THE FIGURES

The accompanying drawings are included to provide a further understanding of the inventive concept, and are incorporated in and constitute a part of this specification. The drawings illustrate aspects of some example embodiments of the inventive concept and, together with the description, serve to explain aspects of some example embodiments of the inventive concept. In the drawings.

DETAILED DESCRIPTION

Figure 1:
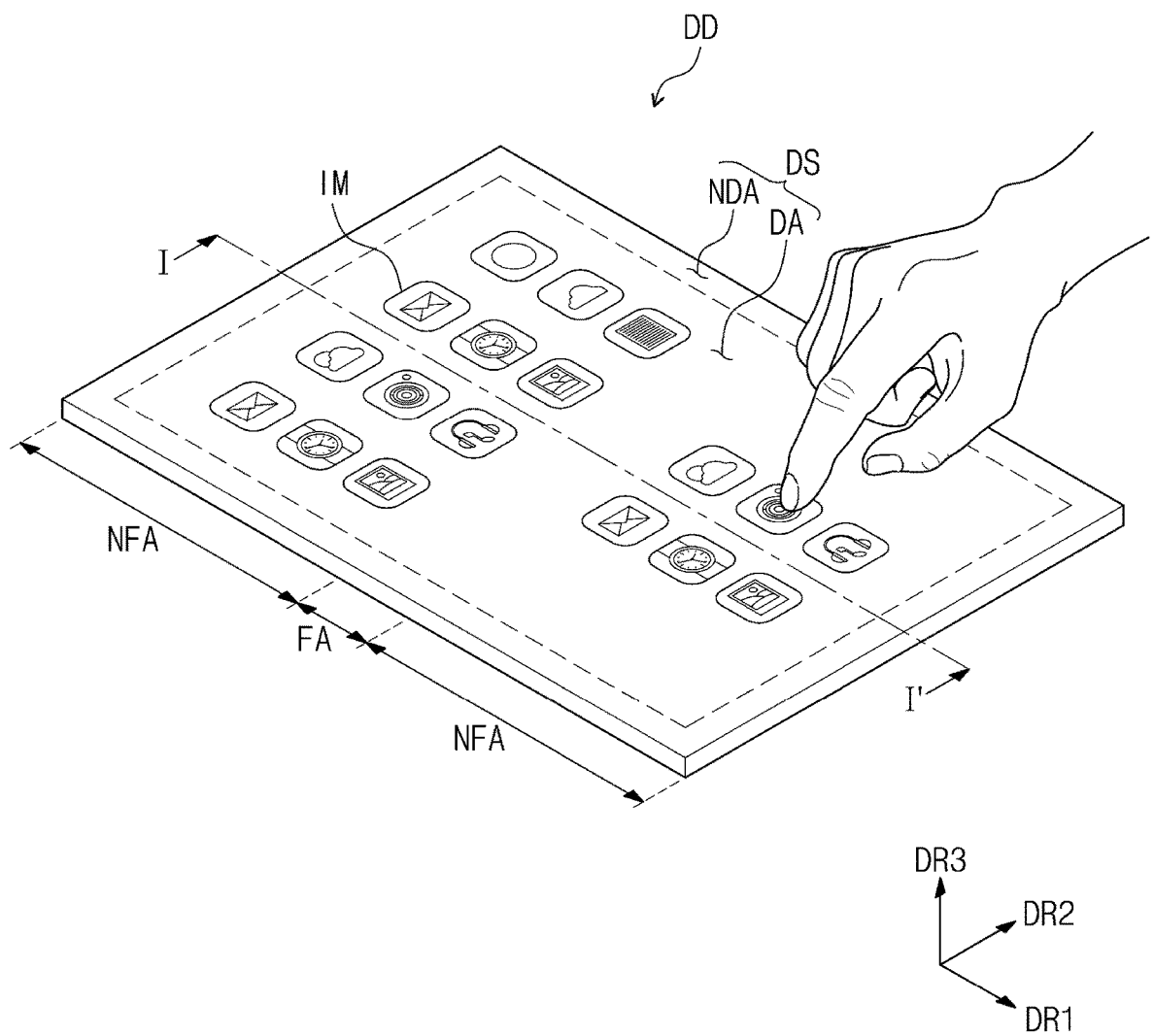
FIG. 1 is a perspective view of a display device according to some example embodiments of the inventive concept.

The inventive concept may be modified in many alternate forms, and thus aspects of some example embodiments will be illustrated in the drawings and described in more detail. It should be understood, however, that it is not intended to limit the inventive concept to the particular forms disclosed, but rather, is intended to cover all modifications, equivalents, and alternatives falling within the spirit and scope of the invention.

In the present disclosure, when an element (or a region, a layer, a portion, etc.) is referred to as being "on," "connected to," or "coupled to" another element, it means that the element may be directly arranged on/connected to/coupled to the other element, or that a third element may be located therebetween. In addition, in the present disclosure, being located "on" not only includes the case of being located above, but also the case of being located below.

Meanwhile, in the present disclosure, being "directly arranged" or "directly located" or "directly positioned" means that there is no layer, film, region, plate or the like added between a portion of a layer, a film, a region, a plate or the like and other portions. For example, being "directly arranged" may mean being arranged without additional members such as an adhesive member between two layers or two members.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are interpreted as being expressly defined herein unless they are interpreted in an ideal or overly formal sense.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, a display panel according to some example embodiments of the inventive concept and a method for manufacturing a display panel according to some example embodiments of the inventive concept will be described in more detail with reference to the accompanying drawings.

Figure 2:
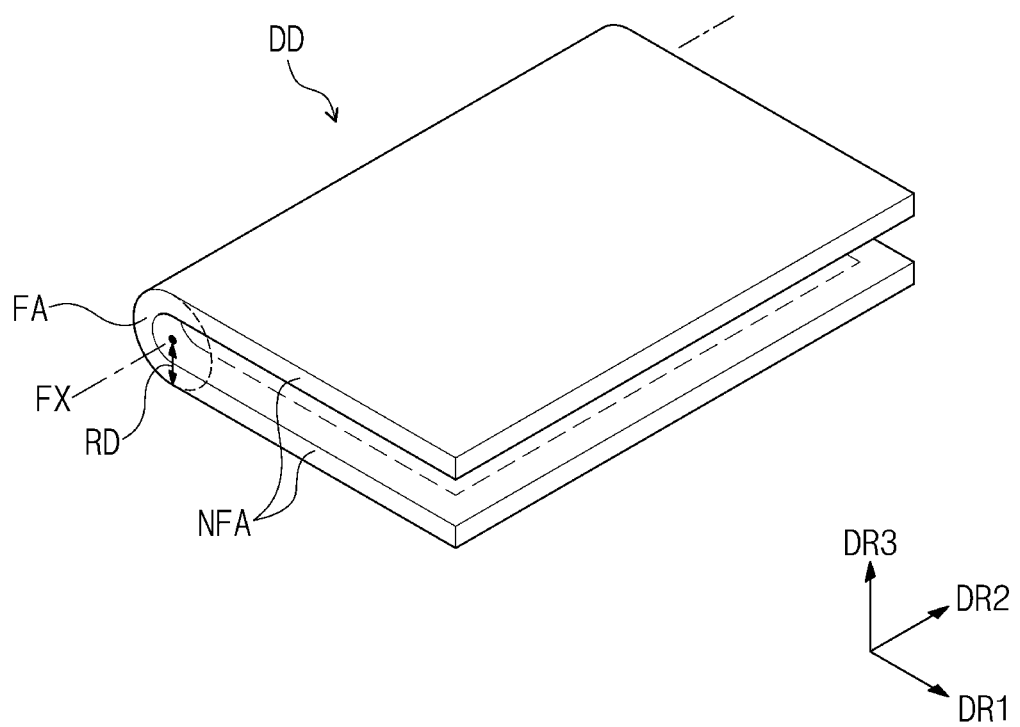
FIG. 2 is a view illustrating a folded state of the display device shown in FIG. 1.
Figure 3:
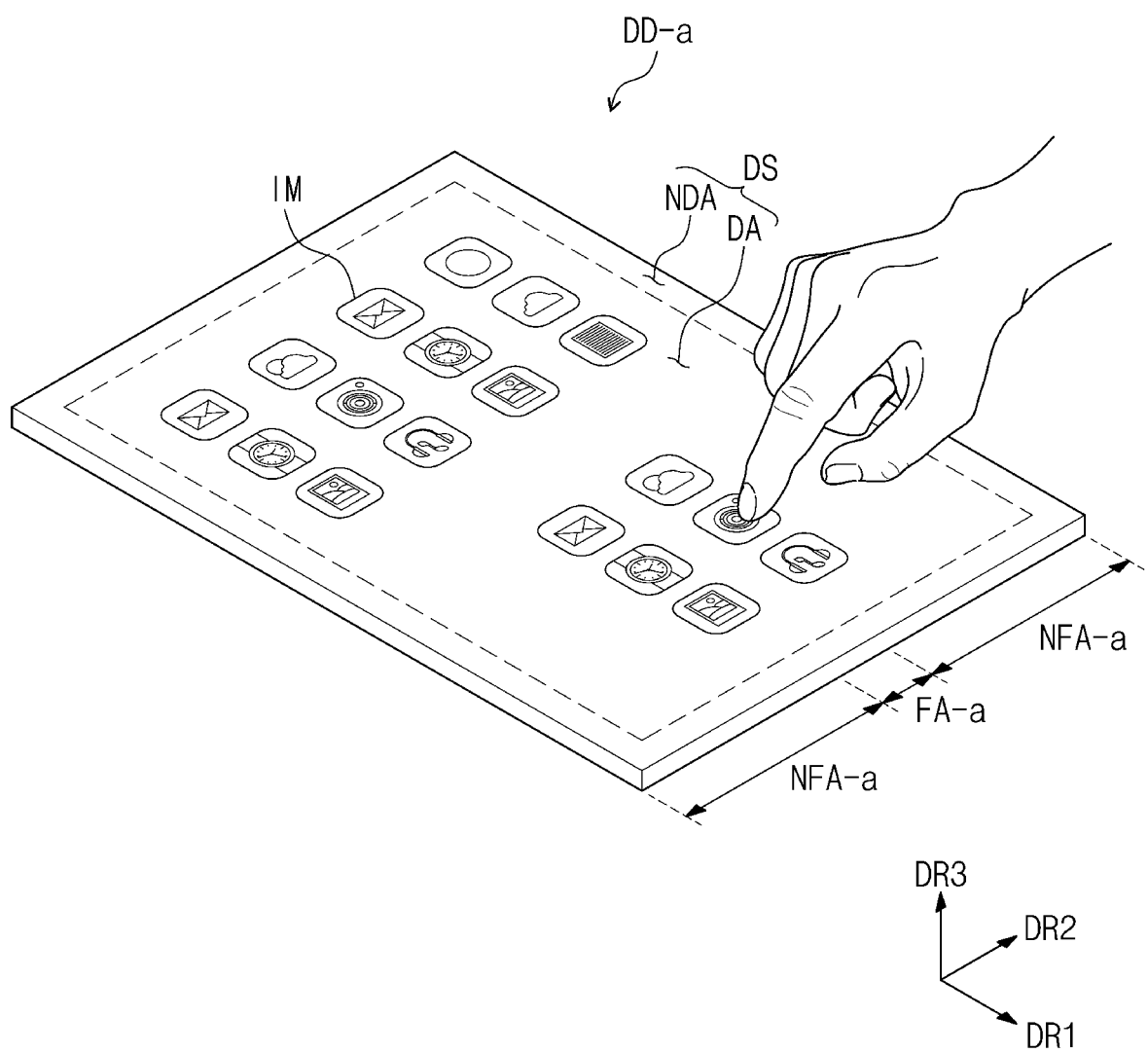
FIG. 3 is a perspective view of a display device according to some example embodiments of the inventive concept.
Figure 4:
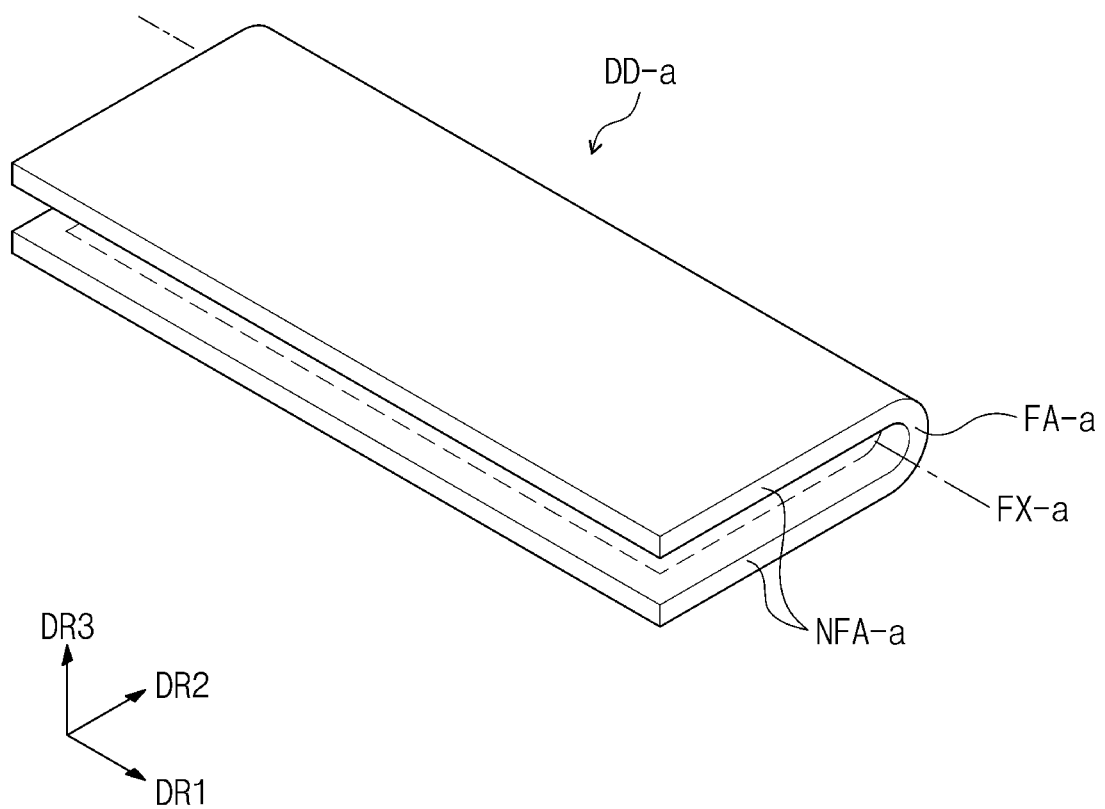
FIG. 4 is a view illustrating a folded state of the display device shown in FIG. 3.

FIG. 1 is a perspective view of a display device according to some example embodiments of the inventive concept. FIG. 2 is a view illustrating a folded state of the display device shown in FIG. 1. FIG. 3 is a perspective view of a display device according to some example embodiments of the inventive concept, and FIG. 4 is a view illustrating a folded state of the display device shown in FIG. 3. In FIGS. 1 to 4, a display device including a display panel according to some example embodiments is illustrated.

Referring to FIG. 1, a display device DD according to some example embodiments may have a rectangular shape which has long sides extending in a first direction axis DR1 direction and short sides extending in a second direction axis DR2 direction which crosses the first direction axis DR1. However, the embodiments of the inventive concept are not limited thereto. The display device DD may have various shapes on a plane, for example, a circular shape, a polygonal shape, etc. The display device DD may be a flexible display device.

In the display device DD according to some example embodiments, a display surface DS on which an image IM is displayed may be parallel to a plane defined by the first direction axis DR1 and the second direction axis DR2. The normal direction of the display surface DS, that is, the thickness direction of the display device DD is indicated by a third direction axis DR3. A front surface (or an upper surface) and a back surface (or a lower surface) of each member are distinguished by the third direction axis DR3. However, the directions indicated by the first to third direction axes DR1, DR2, and DR3 are relative concepts, and may be converted to different directions. Hereinafter, first to third directions are the directions indicated by the first to third direction axes DR1, DR2, DR3, respectively, and are given the same reference numerals as the corresponding ones.

The display device DD according to some example embodiments may include a folding region FA and a non-folding region NFA. Referring to FIG. 1 and FIG. 2, the display device DD may include the folding region FA and a plurality of non-folding regions NFA. The folding region FA is located between the non-folding regions NFA, and the folding region FA and the non-folding regions NFA may be arranged adjacent to each other in the direction of the first direction axis DR1.

The folding region FA may be a portion deformable into a folded shape with respect to a folding axis FX extending in the direction of the second direction axis DR2. The folding region FA may have a radius of curvature RD of 5 mm or less.

FIG. 1 and FIG. 2 show an example of one folding region FA and two non-folding regions NFA. However, the numbers of the folding region FA and the non-folding regions NFA are not limited thereto. For example, the display device DD may include a plurality of non-folding regions NFA which are more than two and a plurality of folding regions FA located between the non-folding regions NFA.

In the display device DD according to some example embodiments, the non-folding regions NFA may be arranged to be symmetrical to each other with respect to the folding region FA. However, the embodiments of the inventive concept are not limited thereto. The folding region FA is located between the non-folding regions NFA, but the areas of two non-folding regions NFA facing each other with respect to the folding region FA may be different.

The display surface DS of the display device DD may include a display region DA and a non-display region NDA around the display region DA. The display region DA displays an image, and the non-display region NDA may not display an image. The non-display region NDA surrounds the display region DA, and may defined the edge of the display device DD.

Referring to FIG. 2, the display device DD may be a foldable display device DD which is folded or unfolded. For example, the folding region FA may be bent with respect to the folding axis FX which is parallel to the second direction axis DR2, such that the display device DD is folded. The folding axis FX may be defined as a short axis parallel to a short side of the display device DD.

When the display device DD is folded, the non-folding regions NFA face each other, and the display device DD may be in-folded such that the display surface DS is not exposed to the outside. However, the embodiments of the inventive concept are not limited thereto. Unlike what is illustrated in the drawing, the display device DD may be out-folded such that the display surface DS is exposed to the outside.

Except for a folding operation, a display device DD-a illustrated in FIG. 3 may have substantially the same configuration as that of the display device DD illustrated in FIG. 1. Therefore, hereinafter, the folding operation will be mainly described in the description of the display device DD-a illustrated in FIG. 3 and FIG. 4.

Referring to FIG. 3 and FIG. 4, the display device DD-a may include a folding region FA-a and a plurality of non-folding regions NFA-a. The folding region FA-a is located between the non-folding regions NFA-a, and the folding region FA-a and the non-folding regions NFA-a may be arranged adjacent to each other in the second direction axis DR2.

The folding region FA-a may be bent with respect to a folding axis FX-a which is parallel to the first direction axis DR1, such that the display device DD-a is folded. The folding axis FX-a may be defined as a long axis parallel to a long side of the display device DD-a. The display device DD illustrated in FIG. 1 may be folded with respect to the short axis, whereas the display device DD-a illustrated in FIG. 3 may be folded with respect to the long axis. In FIG. 4, the display device DD-a is illustrated as being in-folded such that a display surface DS is not exposed to the outside. However, the embodiments of the inventive concept are not limited thereto. The display device DD-a is folded with respect to the long axis and may be out-folded.

Hereinafter, in the description of a display panel according to some example embodiments, a display panel included in the display device DD folded with respect to the short axis will be described. However, the embodiments are not limited thereto. The content to be described hereinafter may be applied to a display panel included in the display device DD-a folded with respect to the long axis.

In addition, in FIG. 1 to FIG. 4, a foldable display device is illustrated and described. However, the embodiments of the inventive concept are not limited thereto. The contents of a display device and a display panel, according to some example embodiments to be described in more detail later, may be also applied to a bending display device, a rollable display device, a flat rigid display device, a bent rigid display device, and the like.

Figure 5:
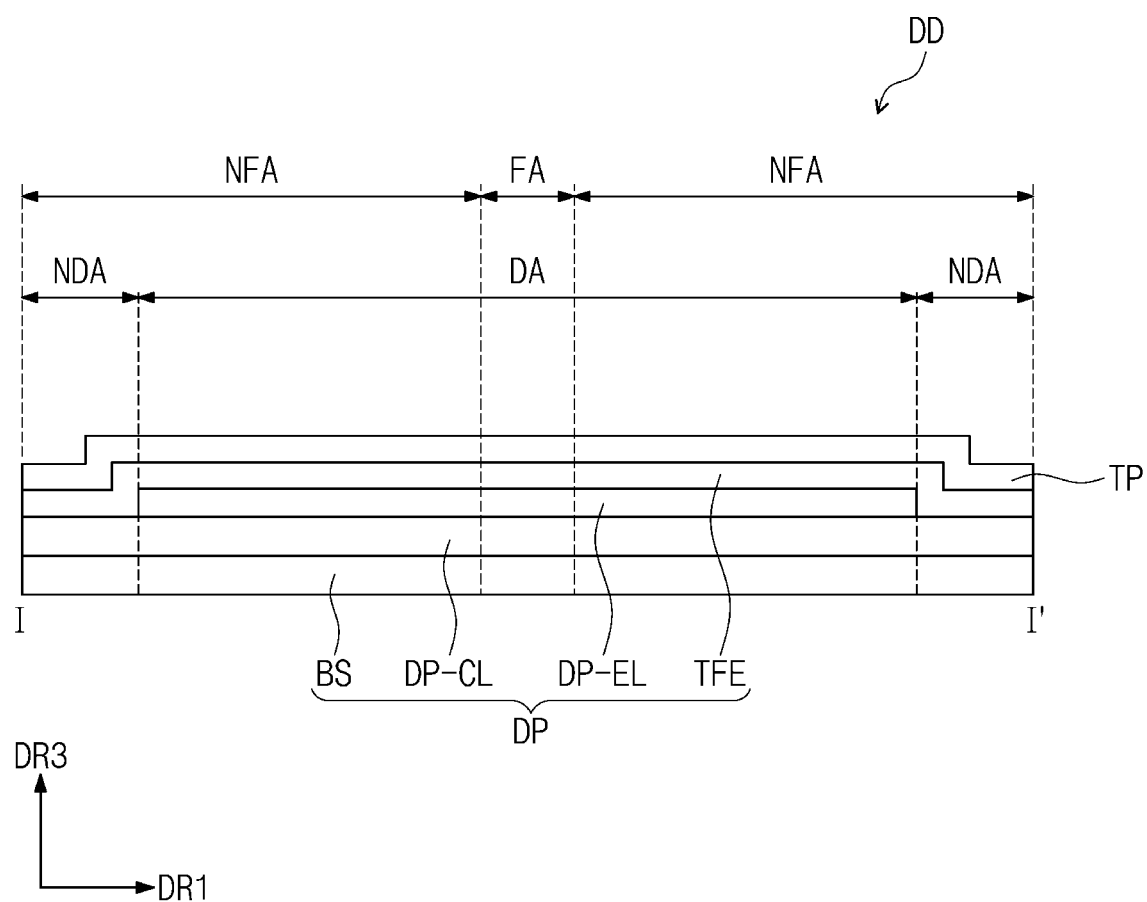
FIG. 5 is a cross-sectional view of a display device according to some example embodiments of the inventive concept.
Figure 6:
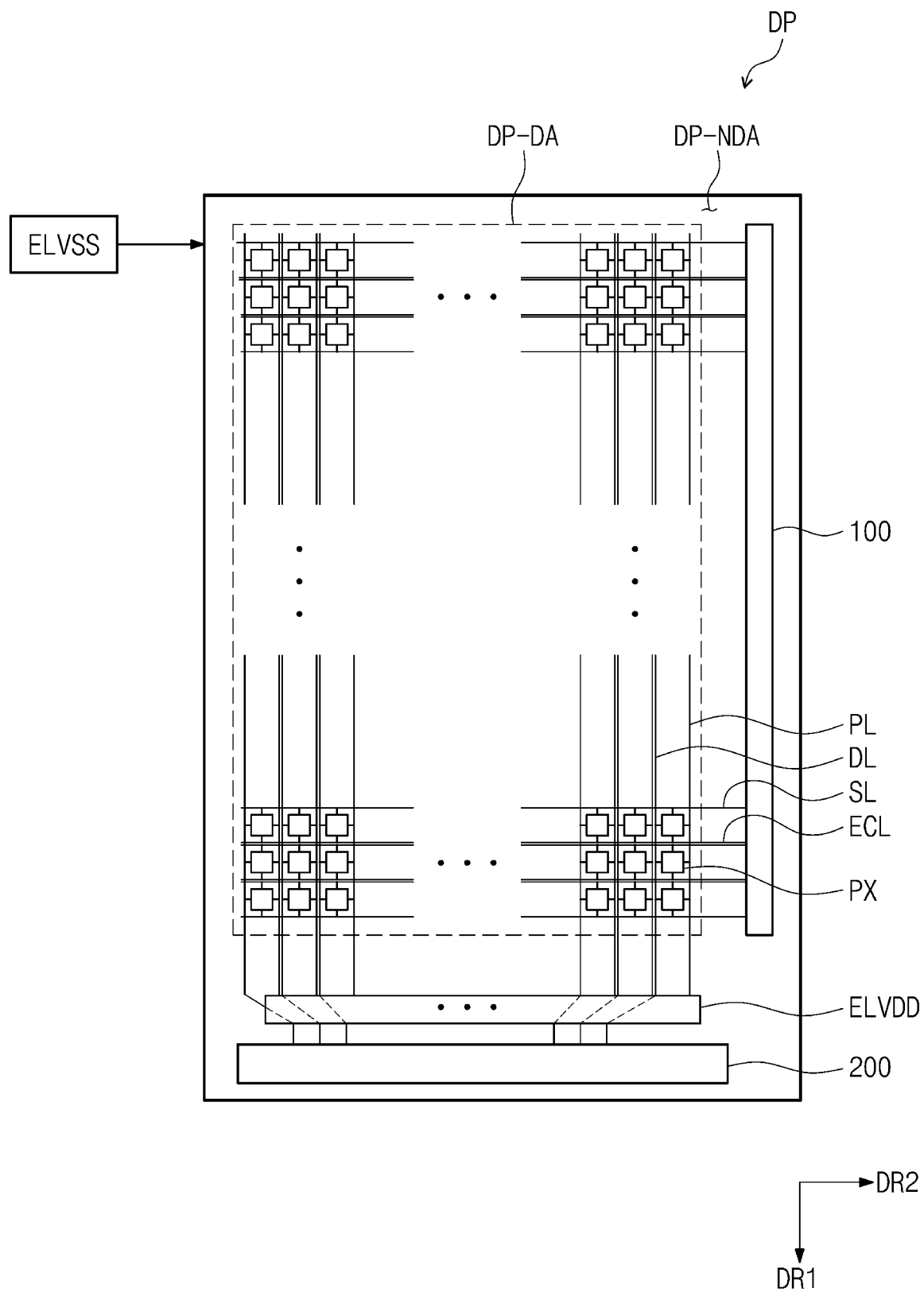
FIG. 6 is a plan view of a display panel according to some example embodiments of the inventive concept.
Figure 7:
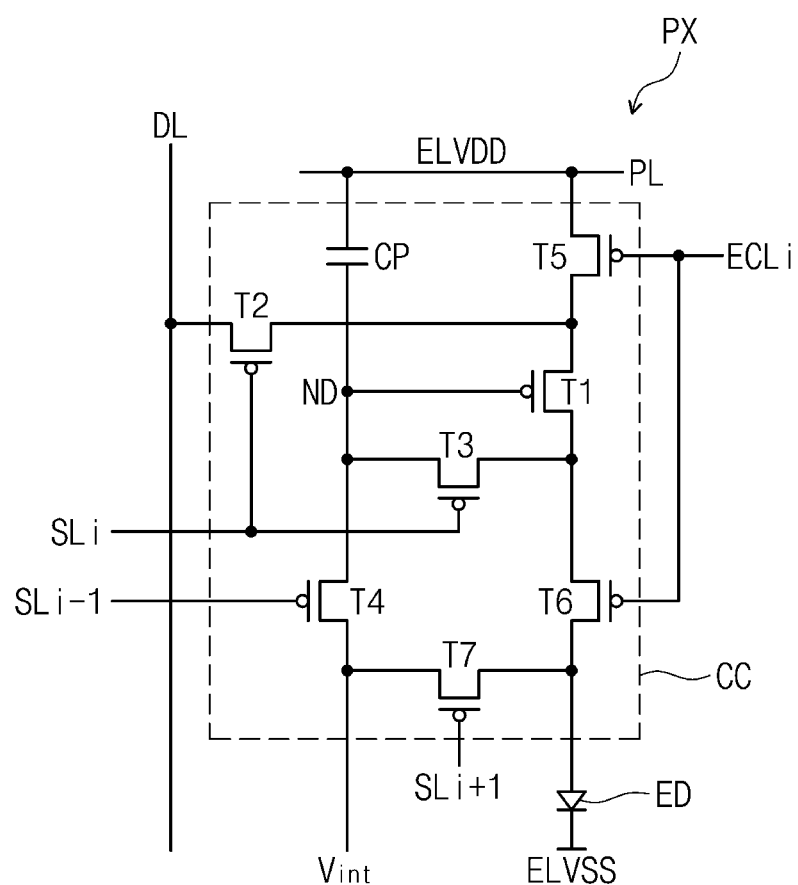
FIG. 7 is an equivalent circuit diagram of a pixel included in a display panel according to some example embodiments of the inventive concept.
Figure 8:
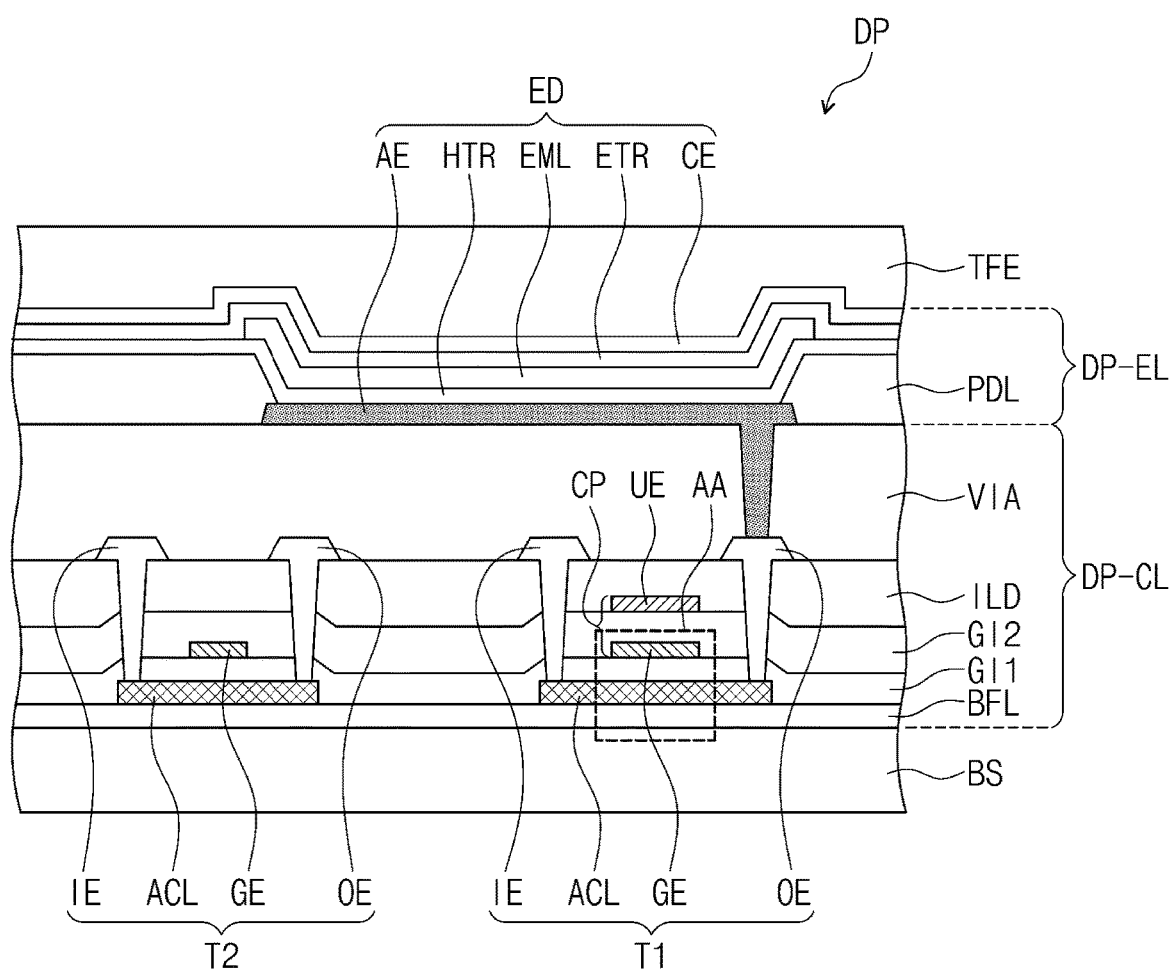
FIG. 8 is a cross-sectional view of a display panel according to some example embodiments of the inventive concept.
Figure 9:
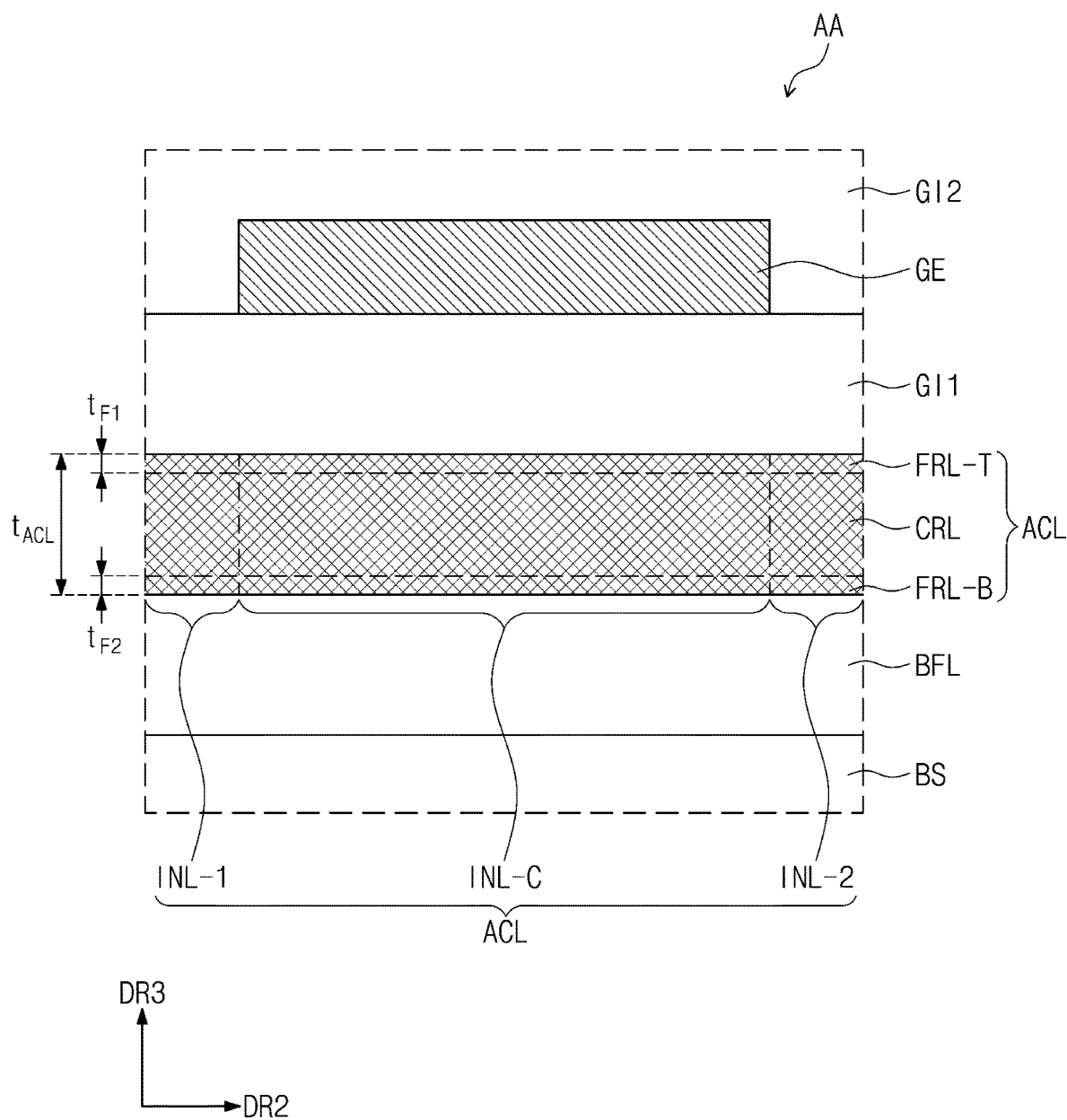
FIG. 9 is a view illustrating an enlarged view of the region AA' of FIG. 8.

FIG. 5 is a cross-sectional view of a display device according to some example embodiments of the inventive concept. FIG. 5 may be a cross-sectional view corresponding to the line I-I' of FIG. 1. FIG. 6 is a plan view of a display panel according to some example embodiments of the inventive concept. FIG. 7 is an equivalent circuit diagram of a pixel PX according to some example embodiments of the present invention. FIG. 8 is a cross-sectional view showing a display panel according to some example embodiments of the inventive concept. FIG. 9 is a cross-sectional view showing a portion of FIG. 8.

The display device DD according to some example embodiments may include a display panel DP and an input sensing unit TP located on the display panel DP.

The display panel DP according to some example embodiments may include a base substrate BS, a circuit layer DP-CL located on the base substrate BS, a display element layer DP-EL located on the circuit layer DP-CL, and an encapsulation layer TFE covering the display element layer DP-EL.

The input sensing unit TP may be located on the encapsulation layer TFE of the display panel DP. The input sensing unit TP may be directly arranged on the encapsulation layer TFE of the display panel DP.

The input sensing unit TP senses an external input and changes the same into a predetermined input signal, and may provide the input signal to the display panel DP. For example, in the display device DD according to some example embodiments, the input sensing unit TP may be a touch sensing unit for sensing a touch. The input sensing unit TP may sense a direct touch of a user, an indirect touch of a user, a direct touch of an object, an indirect touch of an object, or the like. Meanwhile, the input sensing unit TP may sense at least one of the position or the intensity (pressure) of a touch which is applied externally. The input sensing unit TP according to some example embodiments of the inventive concept may have various configurations, or may be composed of various materials, but is not limited to any one embodiment. The input sensing unit TP may include a plurality of sensing electrodes for sensing an external input. The sensing electrodes may sense an external input in a capacitive manner. The display panel DP receives an input signal from the input sensing unit TP, and may generate an image corresponding to the input signal.

The display panel DP may include a folding region FA and a non-folding region NFA. The display panel DP according to some example embodiments may include at least one folding region FA.

Referring to FIG. 6, the display panel DP includes a display region DP-DA and a non-display region DP-NDA. According to some example embodiments, the non-display region DP-NDA may be defined along the edges of the display region DP-DA. The display region DP-DA and the non-display region DP-NDA of the display panel DP may respectively correspond to the display region DA and the non-display region NDA of the display device DD shown in FIG. 1 and the like.

The display panel DP may include a scan driver 100, a data driver 200, a plurality of scan lines SL, a plurality of light emission control lines ECL, a plurality of data lines DL, a plurality of power lines PL, and a plurality of pixels PX (hereinafter, pixels). The pixels PX are located in the display region DP-DA. Each of the pixels PX includes a light emitting element ED and a pixel circuit CC connected thereto.

The scan driver 100 may include a scan driving unit and a light emission control driving unit.

The scan driving unit generates scan signals and sequentially outputs the generated scan signals to the scan lines SL. The light emission control driving unit generates light emission control signals and outputs the generated light emission control signals to the light emission control lines ECL. Meanwhile, according to some example embodiments, the scan driving unit and the light emission control driving unit may not be divided in the scan driver 100, but may be formed as one circuit.

The scan driver 100 may be formed by the same process as the process of the driving circuit of the pixels PX. For example, the scan driver 100 may include a plurality of thin film transistors formed through a step of forming a circuit layer in a method for manufacturing a display panel according to some example embodiments to be described later. In addition, the scan driver 100 may be formed through a low temperature polycrystalline silicon (LTPS) process or a low temperature polycrystalline oxide (LTPO) process.

The data driver 200 outputs data signals to the data lines DL. The data signals are analog voltages corresponding to gray scale values of image data.

According to some example embodiments of the inventive concept, the data driver 200 may be directly arranged on the display panel DP. However, the embodiments of the inventive concept are not limited thereto. In the display panel DP according to some example embodiments, the data driver 200 is mounted on a printed circuit board, and the printed circuit board may be connected to pads located at one end of the data lines DL.

The scan lines SL are extended in the second direction axis DR2 direction, and may be arranged in the direction of the first direction axis DR1 crossing the second direction axis DR2. According to some example embodiments of the inventive concept, the second direction axis DR2 and the first direction axis DR1 may be orthogonal, but the embodiments of the inventive concept are not limited thereto.

The light emission control lines ECL are extended in the direction parallel to the second direction axis DR2, and may be arranged in the direction parallel to the first direction axis DR1. That is, the light emission control lines ECL may each be arranged side-by-side to a corresponding scan line among the scan lines SL.

The data lines DL are extended in the direction parallel to the first direction axis DR1, and may be arranged in the direction parallel to the second direction axis DR2 crossing the first direction axis DR1. The data lines DL may provide data signals to corresponding pixels PX.

The power lines PL are extended in the direction parallel to the first direction axis DR1, and arranged in the direction parallel to the second direction axis DR2. The power lines PL may provide a first power ELVDD to corresponding pixels PX.

The plurality of pixels PX are each connected to a corresponding scan line among the scan lines SL, a corresponding light emission control line among the light emission control lines ECL, a corresponding data line among the data lines DL, and a corresponding power line among the power lines PL.

FIG. 7 is an equivalent circuit diagram of the pixel PX according to some example embodiments.

FIG. 7 illustrates an example pixel PX connected to an $i^{th}$ scan line SLi and an $i^{th}$ light emission control line ECLi. The pixel PX may include a light emitting element ED and a pixel circuit CC. The pixel circuit CC may include a plurality of transistors T1 to T7 and a capacitor CP. The pixel circuit CC controls the amount of current flowing through the light emitting element ED in correspondence to a data signal.

In the display device DD according to some example embodiments, as shown in FIG. 5, the plurality of transistors T1 to T7 may be included in the circuit layer DP-CL of the display panel DP.

The light emitting element ED may emit light at a predetermined luminance in correspondence to the amount of current provided from the pixel circuit CC. To this end, the level of the first power ELVDD may be set to be higher than the level of a second power ELVSS.

The plurality of transistors T1 to T7 may each include an input electrode (or a source electrode), an output electrode (or a drain electrode), and a control electrode (or a gate electrode). In the present disclosure, any one of the input electrode and the output electrode may be referred to as a first driving electrode, and the other thereof may be referred to as a second driving electrode for convenience.

The first driving electrode of a first transistor T1 is connected to the first power ELVDD via a fifth transistor T5, and the second driving electrode thereof is connected to a first electrode AE of the light emitting element ED via a sixth transistor T6. The first transistor T1 may be referred to as a driving transistor in the present disclosure. The first transistor T1 controls the amount of current flowing through the light emitting element ED in correspondence to a voltage applied to the control electrode GE.

A second transistor T2 is connected between the data line DL and the first driving electrode of the first transistor T1. In addition, the control electrode GE of the second transistor T2 is connected to the $i^{th}$ scan line SLi. The second transistor T2 is turned on when an $i^{th}$ scan signal Si is provided to the $i^{th}$ scan line SLi, and electrically connects the data line DL and the first driving electrode of the first transistor T1.

A third transistor T3 is connected between the second driving electrode of the first transistor T1 and the control electrode GE. The control electrode GE of the third transistor T3 is connected to the $i^{th}$ scan line SLi. The third transistor T3 is turned on when the $i^{th}$ scan signal Si is provided to the $i^{th}$ scan line SLi, and electrically connects the second driving electrode of the first transistor T1 and the control electrode GE. Accordingly, when the third transistor T3 is turned on, the first transistor T1 is connected in the form of a diode.

A fourth transistor T4 is connected between a node ND and an initialization power generating unit. In addition, the control electrode GE of the fourth transistor T4 is connected to an $i-1^{st}$ scan line SLi−1. The fourth transistor T4 is turned on when an $i-1^{st}$ scan signal Si−1 is provided to the $i-1^{st}$ scan line SLi−1, and provides an initialization voltage Vint to the node ND.

The fifth transistor T5 is connected between the power line PL and the first driving electrode of the first transistor T1. The control electrode GE of the fifth transistor T5 is connected to an $i^{th}$ light emission control line ECLi.

The sixth transistor T6 is connected between the second driving electrode of the first transistor T1 and the first electrode AE of the light emitting element ED. In addition, the control electrode GE of the sixth transistor T6 is connected to the $i^{th}$ light emission control line ECLi.

A seventh transistor T7 is connected between the initialization power generating unit and the first electrode AE of the light emitting element ED. In addition, the control electrode GE of the seventh transistor T7 is connected to an $i+1^{st}$ scan line SLi+1. The seventh transistor T7 is turned on when an $i+1^{st}$ scan signal Si+1 is provided to the $i+1^{st}$ scan line SLi+1, and provides the initialization voltage Vint to the first electrode AE of the light emitting element ED.

Additionally, FIG. 7 illustrates the control electrode of the seventh transistor T7 connected to the $i+1^{st}$ scan line SLi+1, but the embodiments are not limited thereto. According to some example embodiments of the inventive concept, the control electrode GE of the seventh transistor T7 may be connected to the $i^{th}$ scan line SLi or the $i-1^{st}$ scan line SLi−1.

Although FIG. 7 illustrates a PMOS as a reference, the embodiments are not limited thereto. According to some example embodiments, the pixel PX may be formed of an NMOS. According to some example embodiments of the inventive concept, the pixel PX may be formed of a combination of an NMOS and a PMOS.

The capacitor CP is located between the power line PL and the node ND. The capacitor CP stores a voltage corresponding to a data signal. When the fifth transistor T5 and the sixth transistor T6 are turned on in accordance to the voltage stored in the capacitor CP, the amount of current flowing through the first transistor T1 may be determined.

Meanwhile, the equivalent circuit diagram of the pixel PX in the display panel DP is not limited to the configuration illustrated in FIG. 7. According to some example embodiments of the inventive concept, the pixel PX may be implemented in various forms for emitting the light emitting element ED.

FIG. 8 is a cross-sectional view showing a portion of a display panel according to some example embodiments of the inventive concept. The portion shown in FIG. 8 may correspond to a cross-section of one portion of the pixel PX. FIG. 9 is an enlarged cross-sectional view of one portion of FIG. 8. FIG. 9 is a cross-sectional view showing region "AA" of FIG. 8 in more detail.

The display panel DP according to some example embodiments may include a base substrate BS, a circuit layer DP-CL, a display element layer DP-EL, and an encapsulation layer TFE. According to some example embodiments, the base substrate BS, the circuit layer DP-CL, the display element layer DP-EL, and the encapsulation layer TFE may be sequentially laminated in the direction parallel to the third direction axis DR3. The display element layer DP-EL may include a pixel defining layer PDL and a light emitting element ED.

The base substrate BS may be a member that provides a base surface on which the display element layer DP-EL, the circuit layer DP-CL, and the like are located. The base substrate BS may be formed of a polymer material. For example, the base substrate BS may be a polyimide substrate. However, the embodiments of the inventive concept are not limited thereto, and the base substrate BS may be an inorganic layer, an organic layer, or a composite material layer. The base substrate BS may be a flexible substrate.

According to some example embodiments, the circuit layer DP-CL is located on the base substrate BS, and the circuit layer DP-CL may include a plurality of transistors T1 to T7 (see FIG. 7). The plurality of transistors T1 to T7 (see FIG. 7) may each include a control electrode GE, an input electrode IE, and an output electrode OE. For example, the circuit layer DP-CL may include the plurality of transistors T1 to T7 for driving light emitting elements ED of the display element layer DP-EL. In the cross-sectional views of FIG. 8 and FIG. 9, some of the plurality of transistors T1 to T7 (see FIG. 7) are shown.

Referring FIG. 8, the circuit layer DP-CL may include transistors T1 and T2. The transistors T1 and T2 may each include the control electrode GE, an active layer ACL, the input electrode IE, and the output electrode OE. In addition, the circuit layer DP-CL may further include control electrode insulation layers GI1 and GI2, a buffer layer BFL, an interlayer insulation layer ILD, a circuit insulation layer VIA, and the like. The control electrode insulation layers GI1 and GI2 may include a first control electrode insulation layer GI1 located on a lower portion of the control electrode GE and a second control electrode insulation layer GI2 located on an upper portion of the control electrode GE.

In FIG. 8, an example of the first transistor T1 and the second transistor T2 included in the circuit layer DP-CL are illustrated. However, the configuration of the first transistor T1 and the configuration of the second transistor T2 are not limited thereto. In FIG. 8, although the output electrode OE of the first transistor T1 is shown as being in direct contact with a first electrode AE of the light emitting element ED, this figure is a shape on a cross-section, and is thus shown that way. In practice, as shown in FIG. 7, the first transistor T1 may be connected to the first electrode AE of the light emitting element ED via the sixth transistor T6. However, the embodiments of the inventive concept are not limited thereto. In the display panel DP according to some example embodiments, the output electrode OE of the first transistor T1 may be in direct contact with the first electrode AE of the light emitting element ED.

Referring to FIG. 8 and FIG. 9, the first transistor T1 and the second transistor T2 may each include the active layer ACL, the control electrode GE, the input electrode IE, and the output electrode OE.

In the display panel DP according to some example embodiments, the active layer ACL may be a layer including polycrystalline silicon. The active layer ACL may include boron (B) and fluorine (F). That is, the active layer ACL may be a layer including polycrystalline silicon doped with boron and fluorine.

The active layer ACL may be patterned and provided on the base substrate BS. The active layer ACL may include a core layer CRL and surface layers FRL-T and FRL-B that may be divided in the direction parallel to the third direction axis DR3, which is a thickness direction. The surface layers FRL-T and FRL-B may include a first surface layer FRL-T located on an upper portion of the core layer CRL and a second surface layer FRL-B located on a lower portion of the core layer CRL, based on the core layer CRL.

In the core layer CRL, the concentration of boron may be greater than the concentration of fluorine. In the surface layers FRL-B and FRL-T, the concentration of fluorine may be greater than the concentration of boron. In addition, the concentration of boron included in the core layer CRL may be greater than the concentration of boron included in the surface layers FRL-B and FRL-T, and the concentration of fluorine included in the surface layers FRL-B and FRL-T may be greater than the concentration of fluorine included in the core layer CRL. That is, the surface of the active layer ACL may be a fluorine-rich region in which fluorine atoms are rich.

The ratio of thicknesses $t_{F1}$ and $t_{F2}$ of the surface layers FRL-B and FRL-T to a total thickness $t_{ACL}$ of the active layer ACL may be 10% to 30%. At this time, the thicknesses of the surface layers FRL-B and FRL-T include both a thickness $t_{F1}$ of the first surface layer FRL-T and a thickness $t_{F2}$ of the second surface layer FRL-B. That is, the surface layers FRL-B and FRL-T of the active layer ACL, which are fluorine-rich regions, are provided so as have a ratio of 10% to 30% of the entire active layer ACL from the surface of the active layer, thereby improving the surface properties of the active layer ACL. In addition, the active layer ACL may exhibit improved interface properties between the active layer ACL and a neighboring layer by allowing the thicknesses $t_{F1}$ and $t_{F2}$ of the surface layers FRL-B and FRL-T having a high fluorine concentration to have the ratio of 10% to 30%.

In addition, the active layer ACL may include a channel region INL-C and ion doping regions INL-1 and INL-2. The active layer ACL may include the channel region INL-C overlapping the control electrode GE, and the first ion doping region INL-1 and the second ion doping region INL-2 located at both (e.g., opposite) sides of the channel region INL-C, respectively.

The concentration of boron doped in each of the first ion doping region INL-1 and the second ion doping region INL-2 may be greater than the doping concentration of boron doped in the channel region INL-C.

Meanwhile, the circuit layer DP-CL includes the input electrode IE and the output electrode OE, and the input electrode IE may be connected to the first ion doping region INL-1, and the output electrode OE may be connected to the second ion doping region INL-2.

The control electrode GE may be located spaced apart from the active layer ACL with the first control electrode insulation layer GI1 interposed therebetween. The control electrode GE may be located on the active layer ACL. The control electrode GE may be electrically connected to the first transistor T1 and to one electrode of the capacitor CP which have been described with reference to FIG. 7. The control electrode GE of the first transistor T1 may be any one of two electrodes constituting the capacitor CP.

The control electrode GE may include gold (Au), silver (Ag), copper (Cu), aluminum (Al), nickel (Ni), platinum (Pt), magnesium (Mg), chromium (Cr), tungsten (W), molybdenum (Mo), titanium (Ti), or at least one alloy thereof. The control electrode GE may have a single-layered structure or a multi-layered structure including different metal layers. For example, the control electrode GE may include a triple layer of molybdenum/aluminum/molybdenum, a double layer of copper/titanium, and the like as a metal layer. Meanwhile, the control electrode GE may further include a metal oxide layer. The metal oxide layer may include an indium tin oxide, an indium zinc oxide, a gallium zinc oxide, and the like.

On an upper portion and a lower portion of the control electrode GE, control electrode insulation layers GI1 and GI2 may be further formed. The control electrode insulation layers GI1 and GI2 may include an organic film and/or an inorganic film. The control electrode insulation layers GI1 and GI2 may include a plurality of inorganic films. The control electrode insulation layers GI1 and GI2 may include silicon oxide, silicon nitride, silicon carbide, or a combination thereof.

The first control electrode insulation layer GI1 may cover the active layer ACL. In addition, the second control electrode insulation layer GI2 is located on the first control electrode insulation layer GI1 and may cover the control electrode GE.

Meanwhile, on the first control electrode insulation layer GI1, at least a portion of the scan lines SL (see FIG. 7) and the light emission control lines ECL (see FIG. 7) may be located.

On the second control electrode insulation layer GI2, an upper electrode UE may be located. The upper electrode UE may be connected to the other electrode of the capacitor CP described with reference to FIG. 7. The upper electrode UE of the first transistor T1 may be any one of two electrodes constituting the capacitor CP.

On the second control electrode insulation layer GI2, the interlayer insulation layer ILD covering the upper electrode UE may be located. The interlayer insulation layer ILD may include an organic film and/or an inorganic film. The interlayer insulation layer ILD may include silicon oxide, silicon nitride, silicon carbide, or a combination thereof.

On the interlayer insulation layer ILD, at least a portion of the data line DL (see FIG. 7) and the power line PL (see FIG. 7) may be located. On the interlayer insulation layer ILD, the input electrode IE and the output electrode OE of each of the transistors T1 and T2 may be located.

The input electrodes IE and the output electrodes OE may be connected to the corresponding active layer ACL respectively through through-holes passing through the control electrode insulation layers GI1 and Gi2 and the interlayer insulation layer ILD. That is, the input electrode IE may be connected to the first ion doping region INL-1 and the output electrode OE may be connected to the second ion doping region INL-2.

The input electrode IE and the output electrode OE may include gold (Au), silver (Ag), copper (Cu), aluminum (Al), nickel (Ni), platinum (Pt), magnesium (Mg), chromium (Cr), tungsten (W), molybdenum (Mo), titanium (Ti), or at least one alloy thereof. The input electrode IE and the output electrode OE may have a single-layered structure or a multi-layered structure. In addition, the input electrode IE and the output electrode OE may include a metal oxide layer. The metal oxide layer may include an indium tin oxide, an indium zinc oxide, a gallium zinc oxide, and the like.

On the interlayer insulation layer ILD, the circuit insulation layer VIA covering the input electrode IE and the output electrode OE may be formed. The circuit insulation layer VIA may include an organic film and/or an inorganic film. The circuit insulation layer VIA may provide a flat surface.

The circuit layer DP-CL may include the buffer layer BFL which is an inorganic film. The buffer layer BFL may prevent impurities from being diffused into the first and second transistors T1 and T2. The buffer layer BFL may include silicon oxide, silicon nitride, silicon carbide, or a combination thereof. Meanwhile, the buffer layer BFL may be omitted depending on the material of the base substrate BS and the processing conditions thereof.

The display element layer DP-EL may be formed on the circuit layer DP-CL. The display element layer DP-EL may include the light emitting element ED. The display element layer DP-EL may include an organic electroluminescent element or a quantum dot light emitting element.

Although not illustrated in the drawings, the display element layer DP-EL may include a plurality of light emitting elements ED, and the plurality of light emitting elements ED may emit light of different wavelength regions. However, the embodiments of the inventive concept are not limited thereto. The light emitting elements ED located spaced apart from each other may emit light of the same wavelength region, or at least one thereof may emit light of a different wavelength region.

The light emitting element ED may include the first electrode AE and the second electrode CE facing each other, and a light emitting layer EML located between the first electrode AE and the second electrode CE. In addition, the light emitting element ED may include a hole transport region HTR located between the first electrode AE and the light emitting layer EML, and an electron transport region ETR located between the light emitting layer EML and the second electrode CE. The hole transport region HTR may include a hole injection layer adjacent to the first electrode AE and a hole transport layer located between the hole injection layer and the light emitting layer EML, and the electron transport region ETR may include an electron injection layer adjacent to the second electrode CE and an electron transport layer located between the light emitting layer EML and the electron injection layer.

The first electrode AE may be connected to the output electrode OE. The first electrode AE may be formed of a metal alloy or a conductive compound. The first electrode AE may be an anode. The first electrode AE may be a pixel electrode.

In the light emitting element ED according to some example embodiments, the first electrode AE may be a reflective electrode. However, the embodiments of the inventive concept are not limited thereto. For example, the first electrode AE may be a transmissive electrode or a transflective electrode, and the like. When the first electrode AE is a transmissive electrode or a transflective electrode, the first electrode AE may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). Alternatively, the first electrode AE may be of a multi-layered structure including a reflective film or a transflective film, both formed of the above example materials, and a transparent conductive film formed of indium tin oxide (ITO), indium zinc oxide (IZO), zinc oxide (ZnO), indium tin zinc oxide (ITZO), or the like. For example, the first electrode AE may be a multi-layered metal film or may have a structure in which metal films of ITO/Ag/ITO are laminated.

The second electrode CE may be a common electrode or a cathode. The second electrode CE may be a transmissive electrode, a transflective electrode, or a reflective electrode. When the second electrode CE is a transmissive electrode, the second electrode CE may be formed of a transparent metal oxide, for example, indium tin oxide (ITO), indium zinc oxide (IZO), zinc oxide (ZnO), indium tin zinc oxide (ITZO), or the like.

When the second electrode CE is a transflective electrode or a reflective electrode, the second electrode CE may include Ag, Mg, Cu, Al, Pt, Pd, Au, Ni, Nd, Ir, Cr, Li, Ca, LiF/Ca, LiF/Al, Mo, Ti, or a compound or a mixture thereof (for example, a mixture of Ag and Mg). Alternatively, the second electrode CE may have a multi-layered structure including a reflective film or a transflective film, both formed of the above example materials, and a transparent conductive film formed of indium tin oxide (ITO), indium zinc oxide (IZO), zinc oxide (ZnO), indium tin zinc oxide (ITZO), or the like.

The light emitting layer EML may have a single-layered structure having a single layer formed of a single material, a single-layered structure having a single layer formed of a plurality of different materials, or a multi-layered structure having a plurality of layers formed of a plurality of different materials.

When the display panel DP according to some example embodiments is an organic electroluminescence display panel including organic electroluminescence elements, the light emitting layer EML may include an anthracene derivative, a pyrene derivative, a fluoranthene derivative, a chrysene derivative, a dihydrobenz anthracene derivative, or a triphenylene derivative. Specifically, the light emitting layer EML may include an anthracene derivative or a pyrene derivative.

When the display panel DP according to some example embodiments is a quantum dot light emitting display panel including quantum dot light emitting elements, the display panel DP may include a quantum dot material in the light emitting layer EML. A core of the quantum dot QD may be selected from a Group II-VI compound, a Group III-V compound, a Group IV-VI compound, a Group IV element, a Group IV compound, and a combination thereof.

On the display element layer DP-EL, the encapsulation layer TFE may be located. The encapsulation layer TFE may be a single layer or a plurality of layers laminated. The encapsulation layer TFE may cover the light emitting element ED. The encapsulation layer TFE may be directly arranged on the second electrode CE.

Figure 10A:
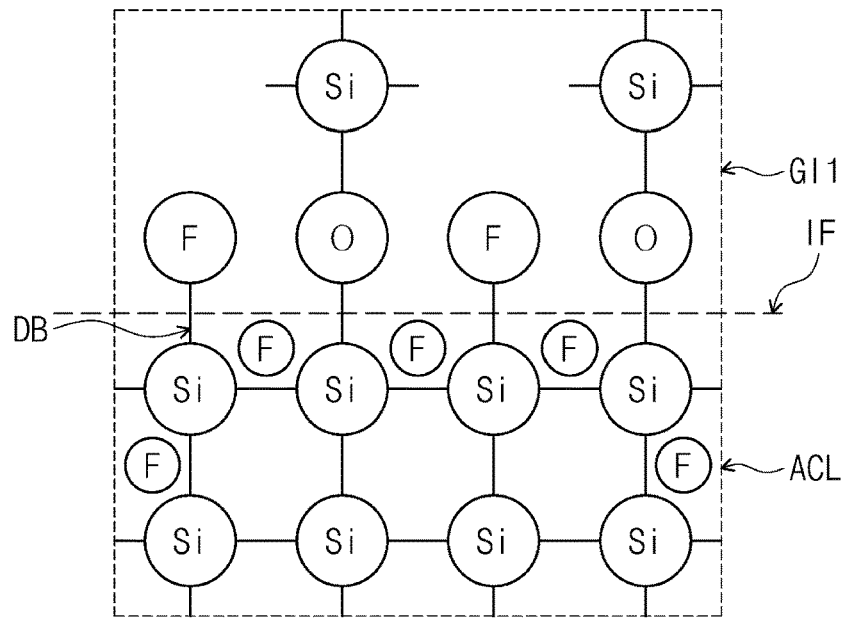
FIG. 10A schematically shows the bonding state at an interface between an active layer and a control electrode insulation layer in a display panel according to some example embodiments of the inventive concept.
Figure 10B:
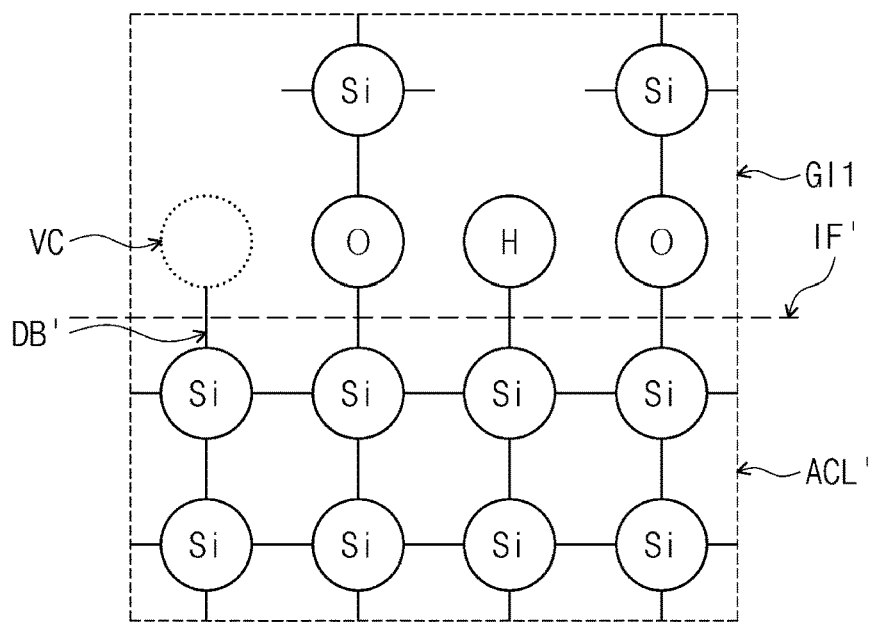
FIG. 10B schematically shows the bonding state at an interface between an active layer and a control electrode insulation layer in a display panel.

FIG. 10A schematically illustrates an interface IF of the active layer ACL and the first control electrode insulation layer GI1 in a circuit layer included in a display panel according to some example embodiments, and adjacent regions thereof. FIG. 10B schematically illustrates an interface IF' of an active layer ACL' and the first control electrode insulation layer GI1 in a circuit layer included in an example display panel, and adjacent regions thereof.

Active layers ACL and ACL' shown in FIG. 10A and FIG. 10B may include crystallized and aligned silicon (Si). Meanwhile, the first control electrode insulation layer GI1 may include a silicon oxide (SiOx).

Referring to FIG. 10A, the active layer ACL may contain fluorine (F) in a region adjacent to the interface IF. Bonding sites DB of the aligned silicon (Si) atoms exposed toward the interface IF side may be bonded to fluorine (F) atoms diffused into the active layer ACL or into the first control electrode insulation layer GI1. Accordingly, according to some example embodiments, the active layer ACL minimizes the exposure of the bonding site DB of silicon (Si) atoms not bonded at the interface IF and has Si—F bonds in which silicon (Si) atoms and fluorine (F) atoms are coupled to have high bonding energy (for example, the bonding energy of Si—F may be 576.4 KJ/mol), thereby exhibiting good reliability properties.

That is, the exposure of the bonding sites DB of the silicon (Si) atoms not bonded to the surface of the active layer ACL adjacent to the interface IF is minimized to minimize a phenomenon in which charges are trapped in the bonding sites DB of the silicon (Si) atoms, thereby increasing the mobility of charges. In addition, because the ratio of silicon (Si) atoms, which are adjacent to the surface of the active layer ACL adjacent to the interface IF to thus form Si—F bonds, is increased, a stable bonding is maintained even under severe processing conditions, so that a display panel according to some example embodiments may exhibit relatively improved reliability properties.

In comparison, FIG. 10B shows a portion of an example active layer ACL' and the first control electrode insulation layer GI1 adjacent thereto, and bonding sites DB' of exposed silicon (Si) atoms not bonded at the interface IF' between the active layer ACL' and the first control electrode insulation layer GI1 may be exposed. The exposed bonding sites DB' may be portions VC in which charges moving along the interface IF' are trapped. Meanwhile, in an example display panel, the first control electrode insulation layer GI1 may include hydrogen (H) atoms. Hydrogen (H) atoms may be bonded to the bonding sites DB' of silicon (Si) atoms not bonded at the active layer ACL' interface IF' to form Si—H bonds. However, because the Si—H bond has relatively low bonding energy (for example, the Si—H bonding energy may be 293.3 KJ/mol) compared with the Si—F bond, when a subsequent process is performed, the Si—H bond is easily broken so that the reliability of the active layer ACL' may be deteriorated.

The display panel DP according to some example embodiments includes transistors each including an active layer doped with fluorine, thereby exhibiting improved reliability. In the transistor according to some example embodiments, the surface of the active layer may have fluorine atoms mainly distributed thereon, and the fluorine atoms may be bonded to silicon atoms of the active layer to form Si—F bonds. Accordingly, a dangling bond of Si exposed at the surface of the active layer is reduced and the stability of the active layer is improved due to the strong bonding energy between the Si-μs, so that charge movement properties in the active layer may be improved. In addition, compared with a case in which the dangling bond of Si is exposed or the dangling bond of Si is bonded to hydrogen atom or the like, defects at an interface between the active layer and the control electrode insulation layer are reduced, thereby preventing moved charges from being trapped by defective sites. Accordingly, the absolute value of a threshold voltage Vth during the driving of the transistor may be decreased, and threshold voltage hysteresis corresponding to the difference between the threshold voltage of the forward and reverse directions may be reduced, and the afterimage retention time during the operation of a display element layer may be reduced.

Figure 11:
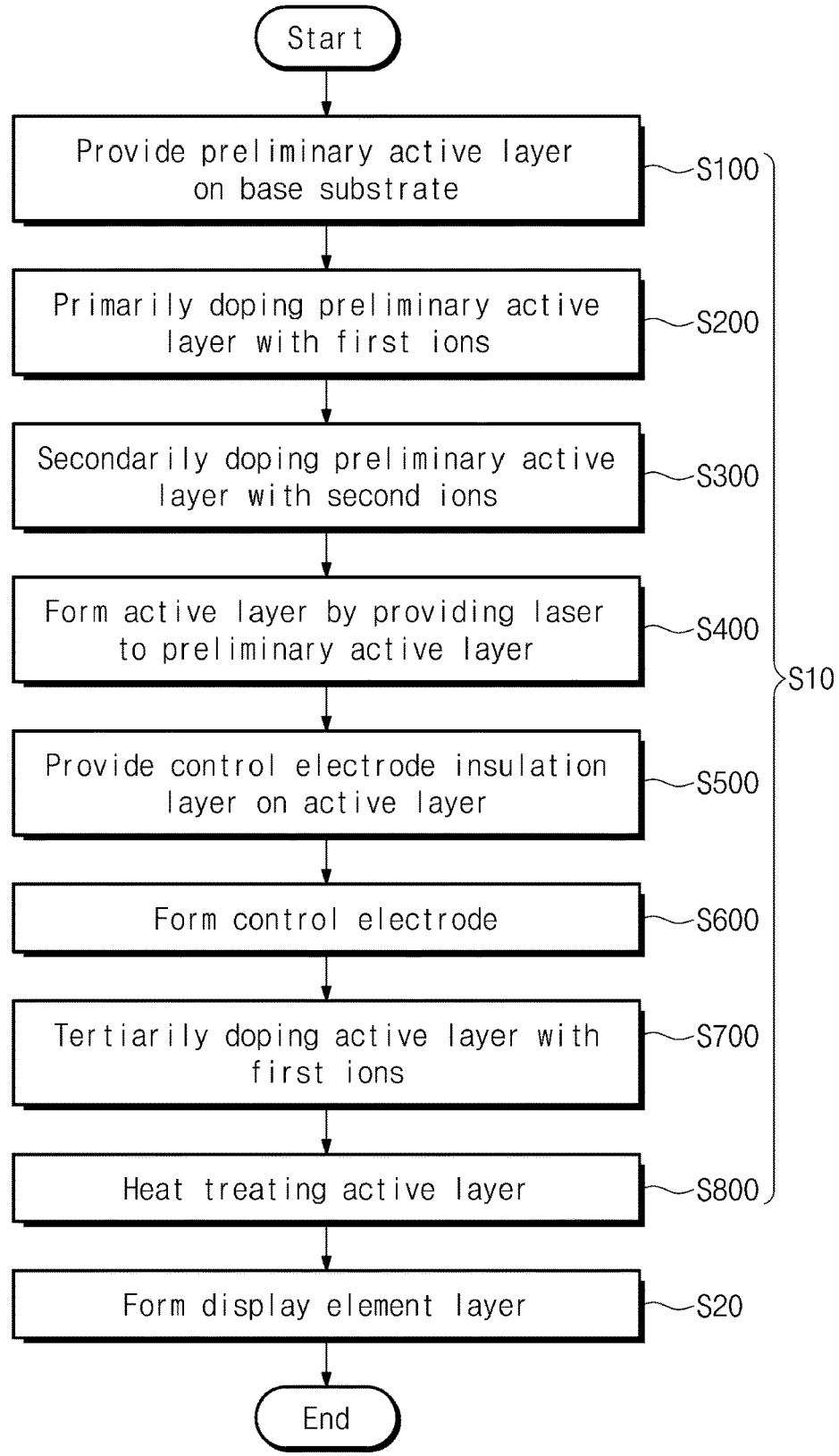
FIG. 11 is a flowchart showing a method for manufacturing a display panel according to some example embodiments of the inventive concept.

Hereinafter, referring to FIG. 11 and FIG. 12A to FIG. 12F, a method for manufacturing a display panel according to some example embodiments will be described. FIG. 11 is a flowchart showing a method for manufacturing a display panel according to some example embodiments of the inventive concept. FIGS. 12A to 12F are schematic views showing some of the steps of the method for manufacturing a display panel according to some example embodiments.

The method for manufacturing a display panel according to some example embodiments may include forming a circuit layer S10 and forming a display element layer S20. In the method for manufacturing a display panel according to some example embodiments, the forming of a circuit layer S10 may include providing a preliminary active layer on a base substrate S100, primarily doping the preliminary active layer with first ions S200, secondarily doping the preliminary active layer with second ions S300, forming an active layer by providing laser light to the preliminary active layer S400, providing a control electrode insulation layer on the active layer S500, forming a control electrode S600, tertiary doping the active layer with the first ions S700, and heat treating the active layer S800. After the heat treating of the active layer S800, forming a display element layer S20 may be performed.

Figure 12A:
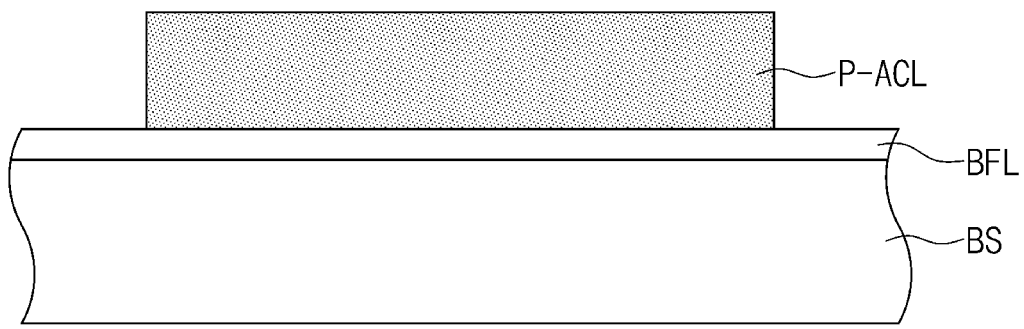
FIGS. 12A to 12F are views showing a method for manufacturing a display panel according to some example embodiments of the inventive concept.

FIG. 12A shows the providing of a preliminary active layer on a base substrate S100. A preliminary active layer P-ACL may be a layer including amorphous silicon. For example, the base substrate BS may include polyimide. The preliminary active layer P-ACL may be provided on the base substrate BS using a deposition method. The preliminary active layer P-ACL may be formed using a method such as sputtering or chemical vapor deposition. Meanwhile, the preliminary active layer P-ACL may be provided on a buffer layer BFL.

Figure 12B:
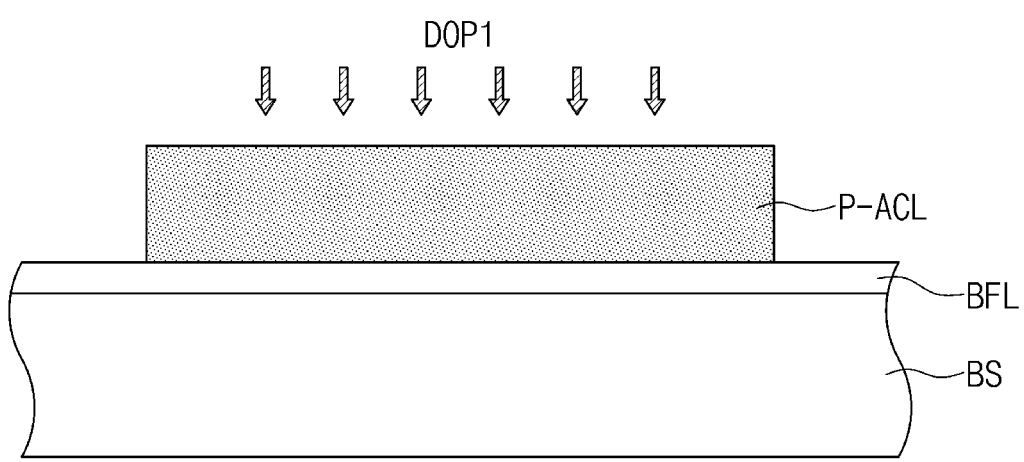

FIG. 12B is a view showing primarily doping the preliminary active layer with first ions S200. In a method for manufacturing a display panel according to some example embodiments, the first ions may be boron (B) ions. Primary doping DOP1 may be performed by implanting boron ions, which are the first ions, into the preliminary active layer P-ACL including amorphous silicon.

Figure 12C:
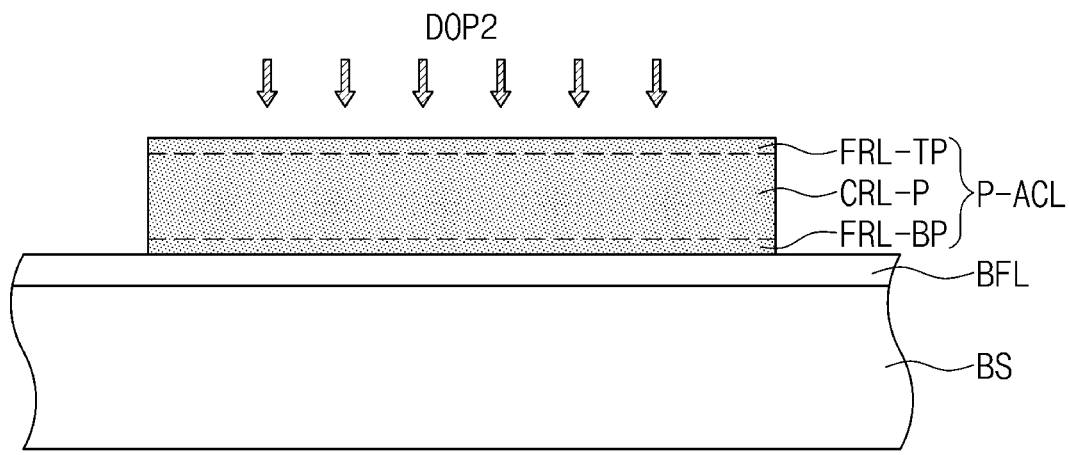

FIG. 12C is a view showing secondarily doping the preliminary active layer with second ions S300. The second ions may be different from the first ions. In the method for manufacturing a display panel according to some example embodiments, the second ions may be fluorine (F) ions. Secondary doping DOP2 may be performed by implanting fluorine ions, which are the second ions, into the preliminary active layer P-ACL into which the primary doping was performed. The preliminary active layer P-ACL into which the secondary doping DOP2 was performed may include a core layer CRL-P and surface layers FRL-TP and FRL-BP. The surface layers FRL-TP and FRL-BP of the preliminary active layer P-ACL may include fluorine ions having a higher concentration than the core layer CRL-P.

Figure 12D:
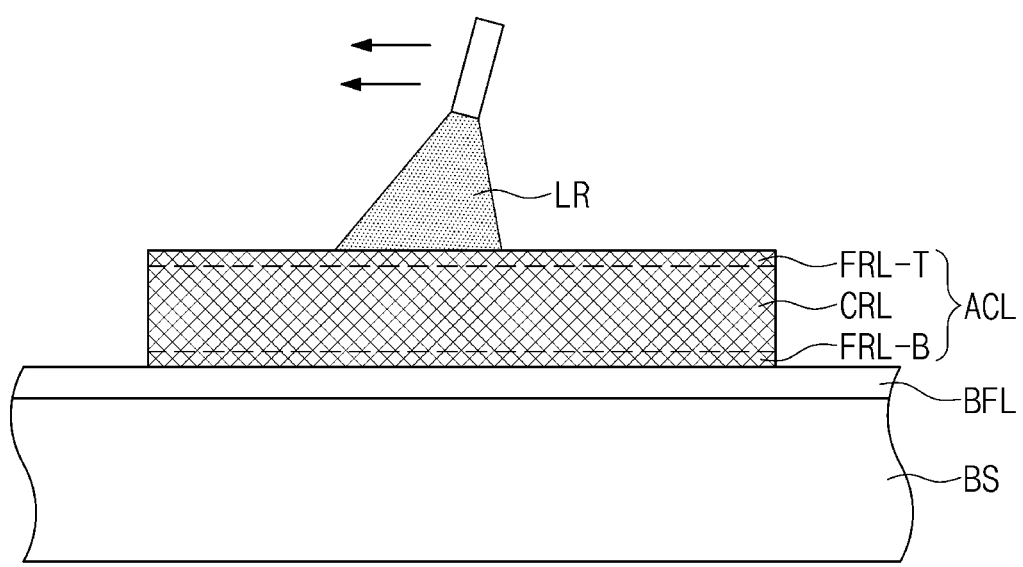

FIG. 12D is a view showing the forming of an active layer by providing laser light to the preliminary active layer S400. Laser light LR may be irradiated onto the preliminary active layer P-ACL (see FIG. 12C) on which the secondary doping was performed with the second ion. The laser light LR may anneal amorphous silicon to crystallize the same into polycrystalline silicon. That is, the preliminary active layer P-ACL (see FIG. 12C) including amorphous silicon may receive the laser light LR to form the active layer ACL including polycrystalline silicon. The laser light LR may be excimer laser light. For example, the laser light LR may be XeCl excimer laser light (wavelength of 308 nm) or XeF excimer laser light (wavelength of 351 nm).

Meanwhile, after the primary doping of the preliminary active layer S200 and the secondary doping of the preliminary active layer S300 which have been described with reference to FIG. 12B and FIG. 12C, the method for manufacturing a display panel according to some example embodiments may provide laser light to the preliminary active layer to activate the doped first ions and second ions with the laser light LR. That is, the forming of an active layer by providing laser light to the preliminary active layer S400 may correspond to activating the doped active layer in addition to the heat treating S800 to be described later.

In the case of the method for manufacturing a display panel according to some example embodiments, the doped preliminary active layer P-ACL may be activated with the laser light LR having a relatively high energy, so that it is possible to lower the temperature of a high-temperature process which is performed to activate the doped ions after the doping step, or to reduce steps or time of the high-temperature process, thereby minimizing damage to the base substrate BS including polyimide and the like.

In addition, after doping the preliminary active layer P-ACL with ions, the preliminary active layer P-ACL may be annealed with laser light LR to increase the activation of the preliminary active layer P-ACL, and to allow the active layer ACL to be recovered from a damage caused during the doping, so that charge movement in the active layer ACL and the reliability of the active layer ACL may be improved. Accordingly, the driving properties a display panel manufactured by the method for manufacturing a display panel according to some example embodiments may be relatively improved.

Figure 12E:
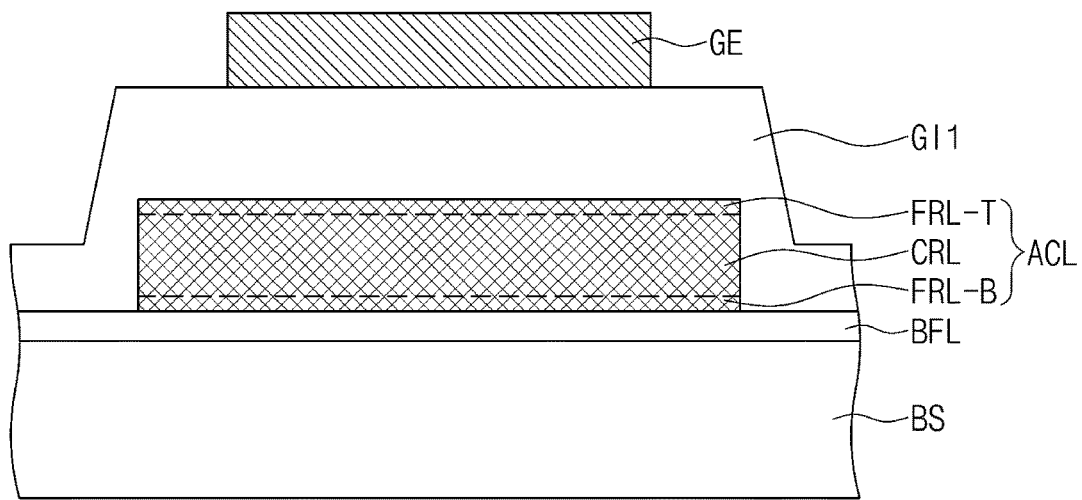

FIG. 12E shows the providing of a control electrode insulation layer on the active layer S500 and the forming of a control electrode S600 in the method for manufacturing a display panel according to some example embodiments. The control electrode insulation layer GI1 may be provided on the active layer ACL. The control electrode insulation layer GI1 may be provided to cover the active layer ACL.

On the control electrode insulation layer GI1, the control electrode GE may be formed. The control electrode GE may be patterned and formed on the control electrode insulation layer GI1 using a photolithography process.

Figure 12F:
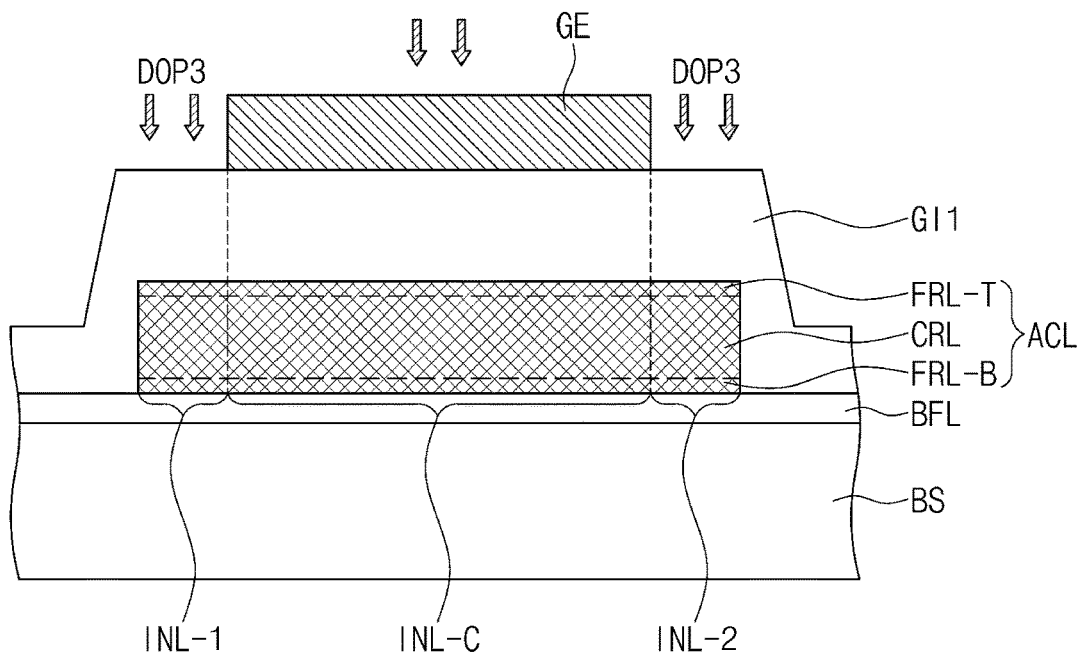

FIG. 12F shows the tertiary doping of the active layer with the first ions S700. The method for manufacturing a display panel according to some example embodiments may include tertiary doping DOP3 the active layer ACL with boron ions which are the first ions. In the tertiary doping of the active layer with the first ions S700, the control electrode GE may serve as a mask. That is, the tertiary doping of the active layer with the first ions S700 may include using the control electrode as a mask to form the ion doping regions INL-1 and INL-2 not overlapping the control electrode GE.

The first ions may be mainly implanted into a region not overlapping the control electrode GE in the active layer ACL. After the tertiary doping of the active layer with the first ions S700, the active layer ACL may include the channel region INL-C overlapping the control electrode GE and the first ion doping region INL-1 and the second ion doping region INL-2 both not overlapping the control electrode GE.

After the tertiary doping of the active layer with the first ions S700, the heat treating of the active layer S800 may be performed. The heat treating of the active layer S800 may be activating the active layer ACL implanted with boron ions and fluorine ions. The heat treating of the active layer S800 may be activating the active layer ACL by providing heat of 250° C. to 480° C. In the case of a display panel according to some example embodiments, an organic material such as polyimide is used as the base substrate BS, and in this case, because there is a limit in the heat resistance of the organic material, the heat treatment temperature should be maintained below 480° C. However, because the activation of ions doped under high temperature conditions is increased, the minimum heat treatment temperature may be 250° C. or higher.

Figure 13:
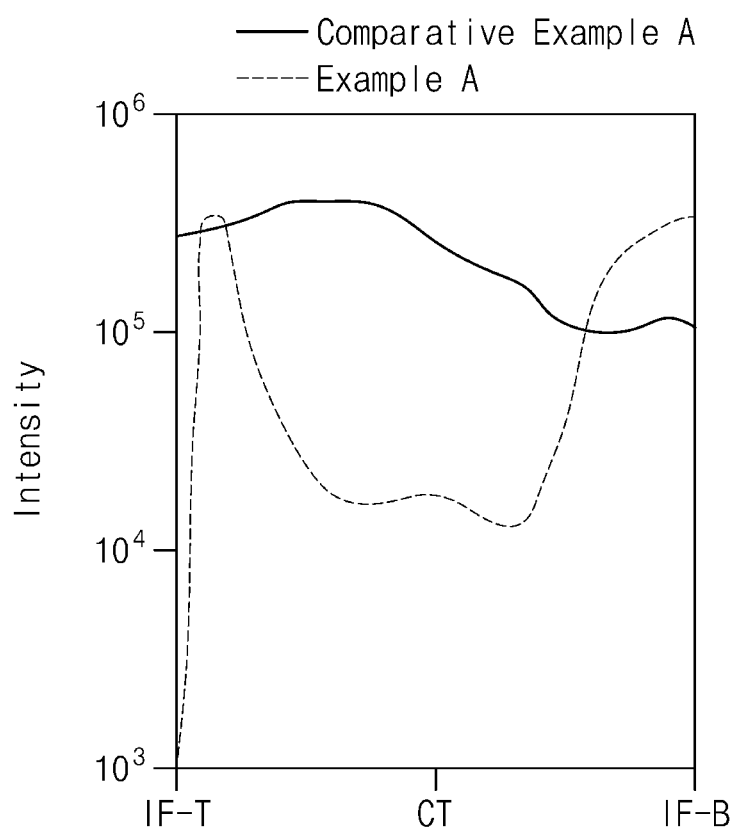
FIG. 13 is a graph showing the distribution of fluorine atoms.

FIG. 13 is a graph showing the distribution of fluorine atoms in active layers of Comparative Example and Example. FIG. 13 shows the result of analyzing the active layers prepared by the processes of Comparative Example and Example, respectively, using Secondary Ion Mass Spectroscopy (SIMS). Example A shows the degree of relative distribution of fluorine atoms in an active layer prepared by the method for manufacturing a display panel according to some example embodiments of the inventive concept. Unlike the method for manufacturing a display panel according to some example embodiments, Comparative Example A shows the degree of relative distribution of fluorine atoms in an active layer prepared by performing annealing on a preliminary active layer with laser light and then performing doping by implanting fluorine ions.

In FIG. 13, "CT" corresponds to a core portion of the active layer, and "IF-T" and "IF-B" correspond to an upper surface and a lower surface of the active layer, respectively. FIG. 13 shows a relative concentration of the fluorine ions according to the thickness direction of the active layer. Meanwhile, in the present specification, the upper surface IF-T of the active layer is a surface of the active layer adjacent to the control electrode insulation layer GI1 (see FIG. 8), and the lower surface IF-B of the active layer is a surface of the active layer adjacent to the base substrate BS (see FIG. 8).

Referring to FIG. 13, in the case of Example A, it can be confirmed that the concentration of fluorine ions in the upper surface IF-T and the lower surface IF-B, which are the surfaces of the active layer, are relatively higher than the fluorine ion concentration in a core portion CT. This is determined to be due to the fact that an active layer was formed by irradiation with laser light after doping of fluorine ions, so that the movement of the implanted fluorine ions was increased, allowing the fluorine ions to be mainly distributed in the surface of the active layer.

In comparison, Comparative Example A forms an active layer by crystallizing amorphous silicon into polycrystalline silicon by irradiating the amorphous silicon with laser light and then implanting fluorine ions, so that the movement of the fluorine ions is low, exhibiting a similar fluorine ion concentration to that in the entire active layer.

That is, in the case of an active layer manufactured by ion doping and then irradiation with laser light as in the method for manufacturing a display panel according to some example embodiments, by using laser light energy to increase the activation of the doped ions, thereby allowing the ions to be distributed mainly in the surface of the active layer, the interface properties between the active layer and a neighboring layer may be improved. Accordingly, a display panel manufactured by the method for manufacturing a display panel according to some example embodiments may exhibit improved reliability properties.

Figure 14A:
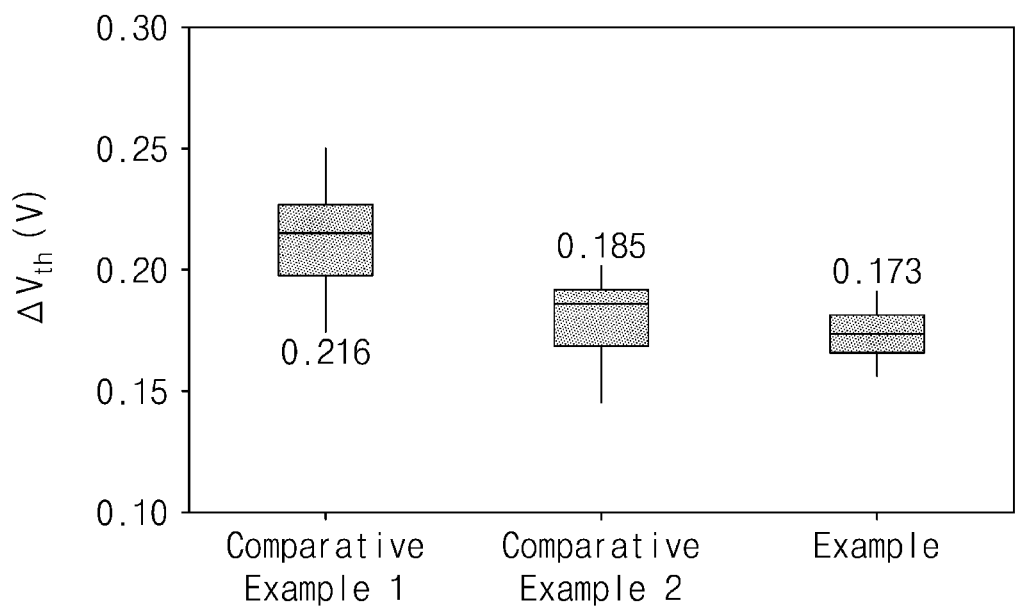
FIG. 14A is a graph showing a change in threshold voltage.
Figure 14B:
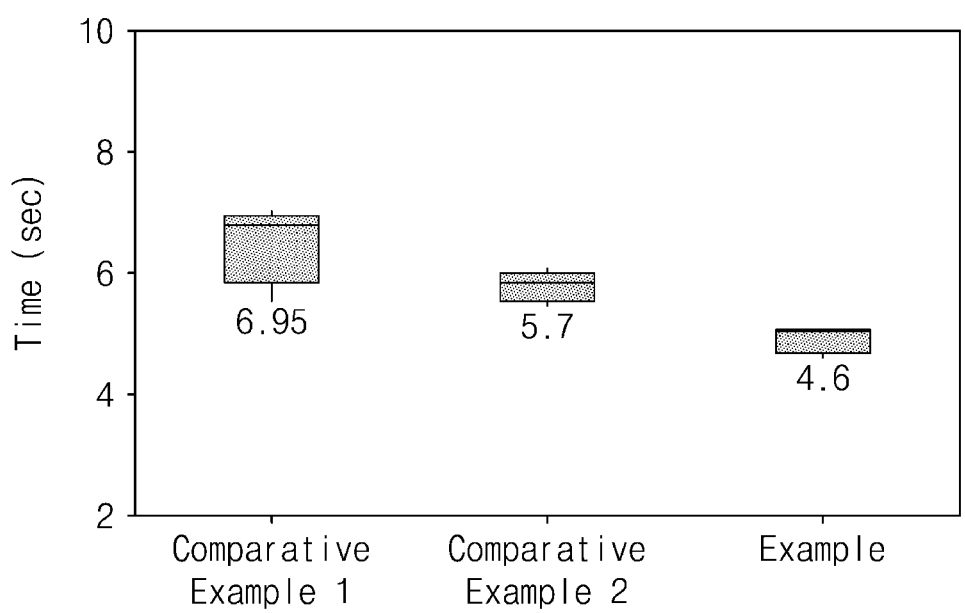
FIG. 14B is a graph showing afterimage retention time.

FIG. 14A is a graph showing a change in threshold voltage in Comparative Examples and Example. FIG. 14B is a graph showing afterimage retention time in Comparative Examples and Example. A change in threshold voltage and afterimage retention time shown in FIG. 14A and FIG. 14B correspond to evaluation items to evaluate the reliability of a display panel.

The change in threshold voltage ($\Delta V_{th}$) shows the difference between the forward threshold voltage and the reverse threshold voltage. As the change in threshold voltage ($\Delta V_{th}$) is small, it can be seen that threshold voltage hysteresis is improved. That is, as the change in threshold voltage ($\Delta V_{th}$) is small, it can be seen that the reliability of a display panel is improved.

The afterimage retention time indicates the retention time of an image provided after a light emitting element is turned off, or the retention time of emitted light. As the afterimage retention time is shorter, it can be seen that an afterimage effect is improved. That is, as the afterimage retention time is shorter, it can be seen that the reliability of a display panel is improved.

In FIG. 14A and FIG. 14B, Comparative Example 1 is the result of an evaluation of a display panel manufactured by irradiation with laser light to form an active layer and then doping by implanting boron ions, and Comparative Example 2 is the result of an evaluation of a display panel manufactured with an active layer formed by doping of boron ions and then irradiation with laser light. Example is the result of an evaluation of a display panel manufactured by the method for manufacturing a display panel according to some example embodiments. That is, Example is the result of an evaluation of a display panel manufactured with an active layer formed by performing a primary doping of boron ions, a secondary doping of fluorine ions, and then irradiation with laser light.

Referring to FIG. 14A, Example shows a smaller change in threshold voltage than Comparative Example 1 and Comparative Example 2. That is, it can be seen that the display panel of Example has improved threshold voltage hysteresis and improved reliability properties when compared with the display panel of each of Comparative Example 1 and Comparative Example 2.

Referring to FIG. 14B, Example shows a shorter afterimage retention time than Comparative Example 1 and Comparative Example 2. That is, it can be seen that the display panel of Example has an improved afterimage effect and improved reliability properties when compared with the display panel of each of Comparative Example 1 and Comparative Example 2.

The method of manufacturing a display panel according to some example embodiments performs ion doping and then irradiation with laser light to form an active layer, so that the activation of the doped active layer is increased while minimizing a high-temperature process, thereby providing a display panel having improved electrical properties and high reliability. In addition, the method for manufacturing a display panel according to some example embodiments performs ion doping and then irradiation with laser light to form an active layer, thereby increasing the activation of the active layer without an ultra-high-temperature (about 1000° C. or higher) process, and thus, may be used for manufacturing a flexible display panel using a base substrate formed by including an organic material. In addition, the method for manufacturing a display panel according to some example embodiments includes both a boron ion doping and a fluorine ion doping to increase the concentration of fluorine ions at the surface of an active layer, thereby improving interface properties between the active layer and a layer adjacent thereto to provide a display panel having excellent reliability properties.

Meanwhile, a display panel according to some example embodiments which is manufactured by the method for manufacturing a display panel according to some example embodiments may exhibit improved threshold voltage hysteresis and an improved afterimage effect without the deterioration in other electrical properties.

In addition, a display panel according to some example embodiments includes a circuit layer having an active layer with a high fluorine concentration in a surface adjacent to the control electrode insulation layer, thereby exhibiting excellent reliability properties.

Some example embodiments of the inventive concept may include a display panel having relatively improved reliability properties and good electrical properties by including an active layer containing fluorine in a surface layer.

Some example embodiments of the inventive concept may also include a method for manufacturing a display panel with relatively improved reliability by performing a doping before crystallizing amorphous silicon using laser light, and further doping fluorine ions in the doping step.

Although the inventive concept has been described with reference to a some example embodiments of the inventive concept, it will be understood by those skilled in the art that various changes in form and details may be made therein without departing from the spirit and scope of the inventive concept.

Accordingly, the technical scope of the inventive concept is not intended to be limited to the contents set forth in the detailed description of the specification, but is intended to be defined by the appended claims, and their equivalents.

What is claimed is:

1. A display panel comprising:
   a base substrate;
   a circuit layer on the base substrate; and
   a display element layer on the circuit layer, wherein the circuit layer includes
   an active layer on the base substrate and containing boron and fluorine;
   a control electrode on the active layer; and a control electrode insulation layer between the active layer and the control electrode, wherein
the active layer includes:
a core layer in which a concentration of the boron is greater than a concentration of the fluorine; and
a surface layer on the core layer and in which a concentration of the fluorine is greater than a concentration of the boron.

2. The display panel of claim 1, wherein the surface layer comprises a first surface layer adjacent to the control electrode insulation layer and a second surface layer adjacent to the base substrate.

3. The display panel of claim 2, wherein the concentration of the fluorine in each of the first surface layer and the second surface layer is greater than the concentration of the fluorine in the core layer.

4. The display panel of claim 1, wherein a thickness of the surface layer compared to a total thickness of the active layer is 10% to 30%.

5. The display panel of claim 1, wherein the base substrate is a polyimide substrate.

6. The display panel of claim 1, wherein the active layer comprises:
a channel region overlapping the control electrode; and
a first ion doping region and a second ion doping region respectively located at both sides of the channel region, wherein
the concentration of the boron in each of the first ion doping region and the second ion doping region is greater than the concentration of the boron in the channel region.

7. The display panel of claim 6, wherein the circuit layer further comprises:
an input electrode connected to the first ion doping region; and
an output electrode connected to the second ion doping region.

8. The display panel of claim 7, wherein the display element layer comprises:
a first electrode electrically connected to the output electrode;
a second electrode facing the first electrode; and
a light emitting layer between the first electrode and the second electrode.

9. The display panel of claim 1, wherein the display element layer comprises an organic electroluminescent element or a quantum dot light emitting element.

10. The display panel of claim 1, further comprising a buffer layer between the base substrate and the active layer.

11. A display panel including at least one folding region, the display panel comprising:
a base substrate;
a circuit layer on the base substrate; and
a display element layer on the circuit layer and including a light emitting element, wherein
the circuit layer includes:
an active layer on the base substrate and containing boron and fluorine;
a control electrode on the active layer; and
a control electrode insulation layer between the active layer and the control electrode, wherein
the active layer includes a core layer and a surface layer on the core layer,
wherein the core layer contains both the boron and the fluorine, and wherein,
a concentration of the fluorine at the surface layer adjacent to the control electrode insulation layer, is greater than a concentration of the fluorine in the core layer.

12. The display panel of claim 11, wherein the active layer comprises:
a channel region overlapping the control electrode; and
a first ion doping region and a second ion doping region respectively located at both sides of the channel region, wherein
a concentration of the boron in each of the first ion doping region and the second ion doping region is greater than a concentration of the boron in the channel region.

13. The display panel of claim 11, wherein the base substrate comprises polyimide.

* * * * *